US011096321B2

(12) United States Patent
Oyama

(10) Patent No.: US 11,096,321 B2
(45) Date of Patent: Aug. 17, 2021

(54) COMPONENT SUPPLY DEVICE AND COMPONENT MOUNTING MACHINE EQUIPPED WITH SAME

(71) Applicant: YAMAHA HATSUDOKI KABUSHIKI KAISHA, Iwata (JP)

(72) Inventor: Kazuyoshi Oyama, Shizuoka (JP)

(73) Assignee: YAMAHA HATSUDOKI KABUSHIKI KAISHA, Iwata (JP)

( * ) Notice: Subject to any disclaimer, the term of this patent is extended or adjusted under 35 U.S.C. 154(b) by 224 days.

(21) Appl. No.: 16/495,077

(22) PCT Filed: Mar. 24, 2017

(86) PCT No.: PCT/JP2017/012171
§ 371 (c)(1),
(2) Date: Sep. 17, 2019

(87) PCT Pub. No.: WO2018/173296
PCT Pub. Date: Sep. 27, 2018

(65) Prior Publication Data
US 2020/0053922 A1 Feb. 13, 2020

(51) Int. Cl.
*H05K 13/04* (2006.01)
*H05K 13/00* (2006.01)
(Continued)

(52) U.S. Cl.
CPC ..... *H05K 13/0419* (2018.08); *H05K 13/0084* (2013.01); *H05K 13/02* (2013.01); *H05K 13/086* (2018.08); *Y10T 29/53174* (2015.01)

(58) Field of Classification Search
CPC .............. H05K 13/0084; H05K 13/02; H05K 13/0417; H05K 13/0419; H05K 13/086;
(Continued)

(56) References Cited

U.S. PATENT DOCUMENTS

2003/0159279 A1 8/2003 Bachthaler et al.
2003/0219330 A1 11/2003 Lyndaker et al.
(Continued)

FOREIGN PATENT DOCUMENTS

CN 101507382 A 8/2009
CN 101518173 A 8/2009
(Continued)

OTHER PUBLICATIONS

International Search Report issued in PCT/JP2017/012171; dated Jun. 27, 2017.

*Primary Examiner* — Peter Dungba Vo
*Assistant Examiner* — Joshua D Anderson
(74) *Attorney, Agent, or Firm* — Studebaker & Brackett PC

(57) ABSTRACT

A component supply device, in which, a component storage tape is introduced to a first tape feed-out, unit through a tape introduction guiding unit, a first tape feed-out control unit controls the first tape feed-out unit to feed out the component storage tape. A first calculation unit calculates a standard tape length of the component storage tape. A second calculation unit calculates, based on the standard tape length, a target feed-out length of the component storage tape to be fed out by the second tape feed-out unit, so that a center of a leading component storage unit of the component storage tape coincides with a component extraction position. A second tape feed-out control unit controls the second tape feed-out unit so that the component storage tape is fed out based on the target feed-out length.

13 Claims, 22 Drawing Sheets

(51) Int. Cl.
*H05K 13/02* (2006.01)
*H05K 13/08* (2006.01)

(58) Field of Classification Search
CPC ......... Y10T 29/53174; Y10T 29/53178; Y10T 29/53191
See application file for complete search history.

(56) References Cited

U.S. PATENT DOCUMENTS

| | | |
|---|---|---|
| 2010/0071204 A1 | 3/2010 | Yonemitsu et al. |
| 2010/0206932 A1* | 8/2010 | Wada ................. H05K 13/0417 226/200 |
| 2010/0242267 A1 | 9/2010 | Tsukagoshi |
| 2011/0072654 A1* | 3/2011 | Oyama ............. H05K 13/0417 29/832 |
| 2017/0072710 A1 | 3/2017 | Matsumori et al. |
| 2018/0376630 A1* | 12/2018 | Otsuki ................... B26D 1/305 |

FOREIGN PATENT DOCUMENTS

| | | |
|---|---|---|
| JP | 2004-268916 A | 9/2004 |
| JP | 2005-539370 A | 12/2005 |
| JP | 2011-155051 A | 8/2011 |
| JP | 2011-181816 A | 9/2011 |
| JP | 2012-142347 A | 7/2012 |
| JP | 2017-059610 A | 3/2017 |

\* cited by examiner

FIG.3
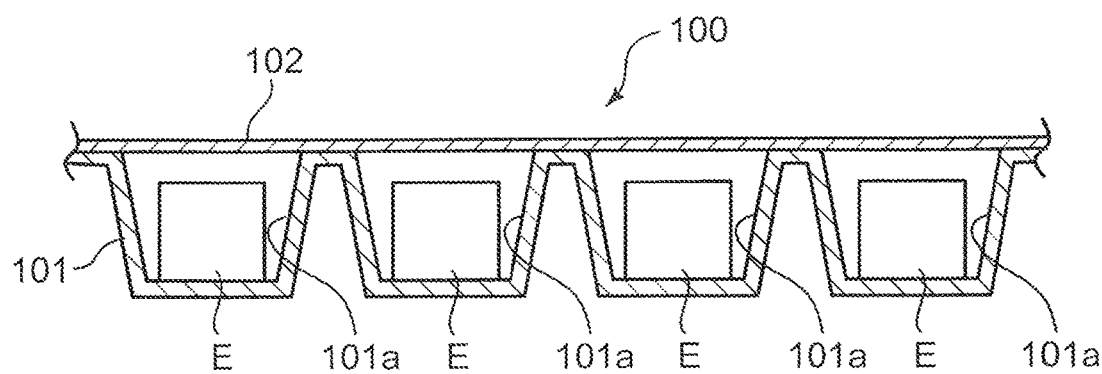
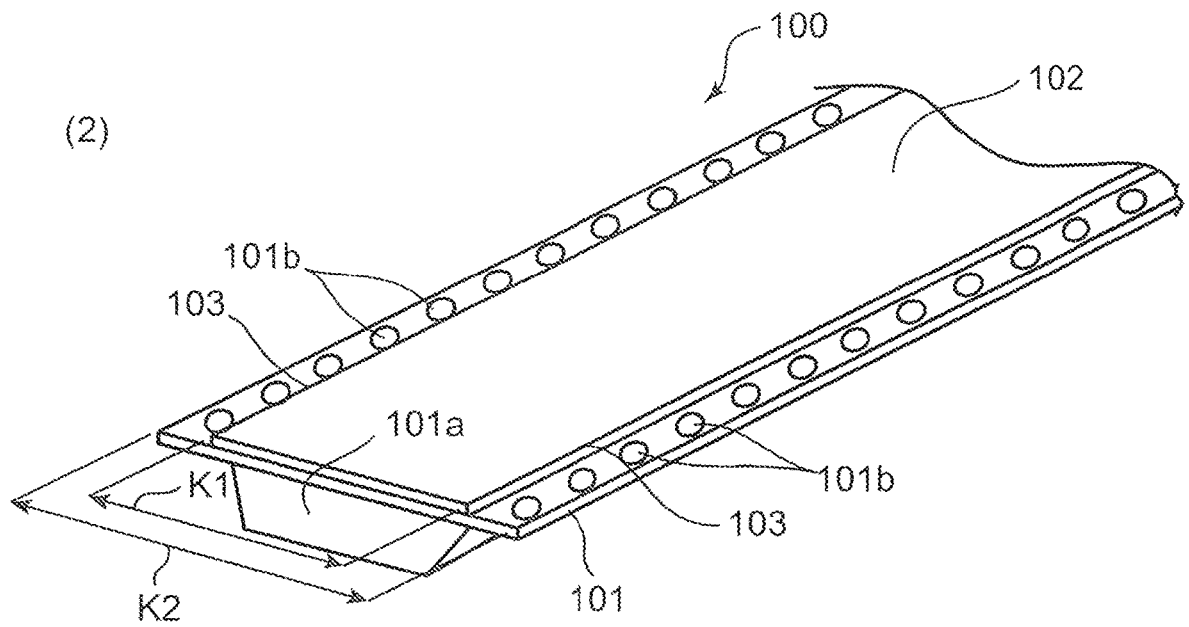

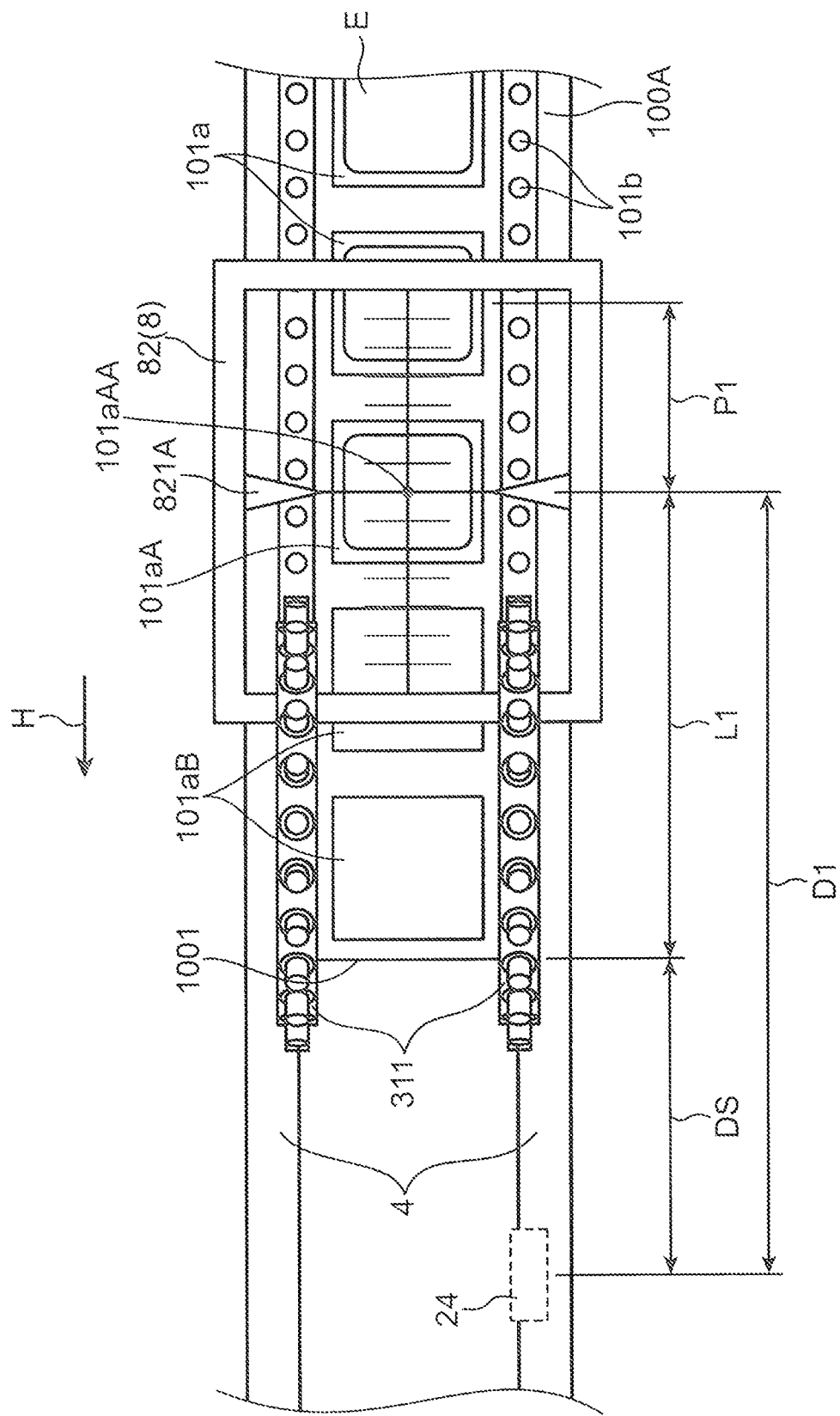

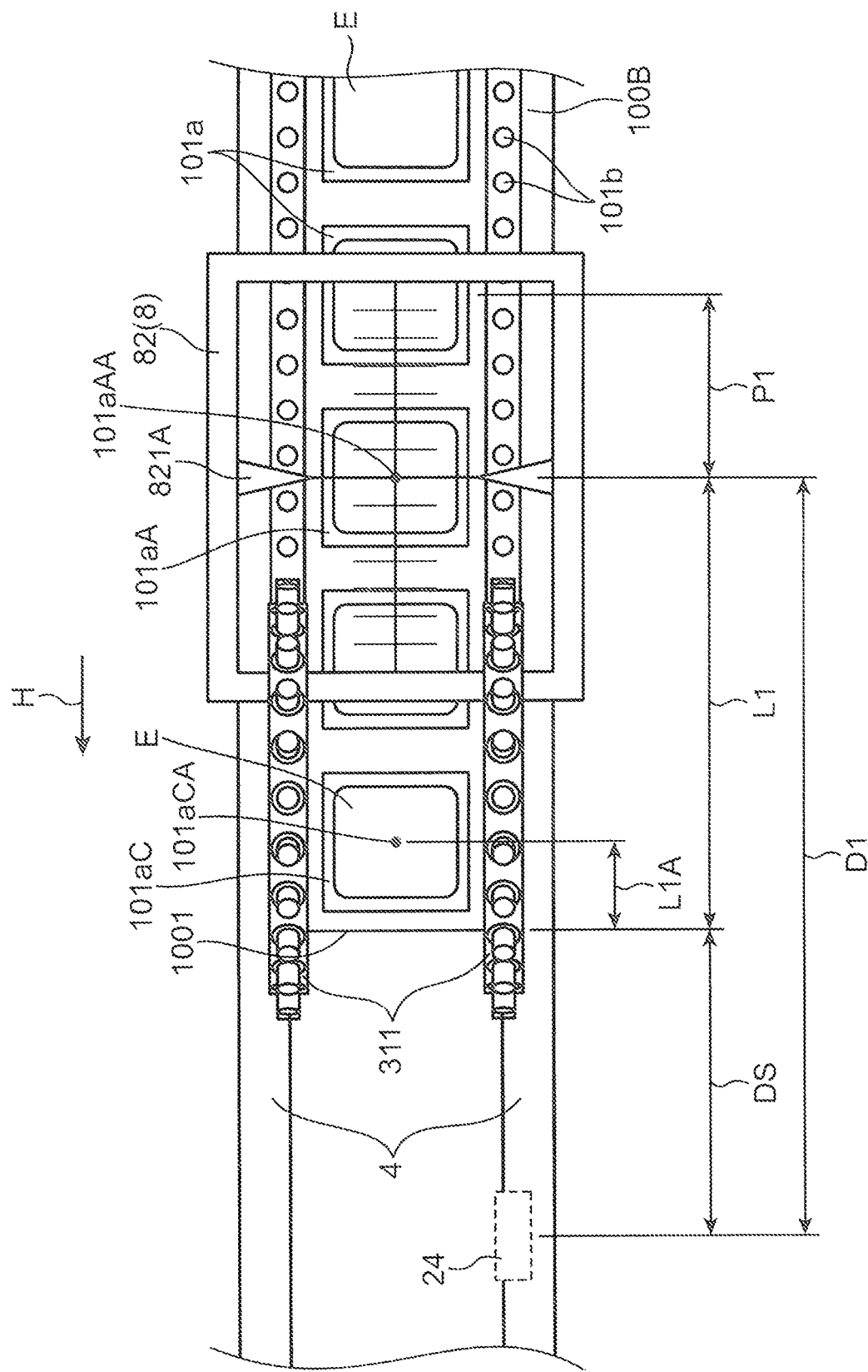

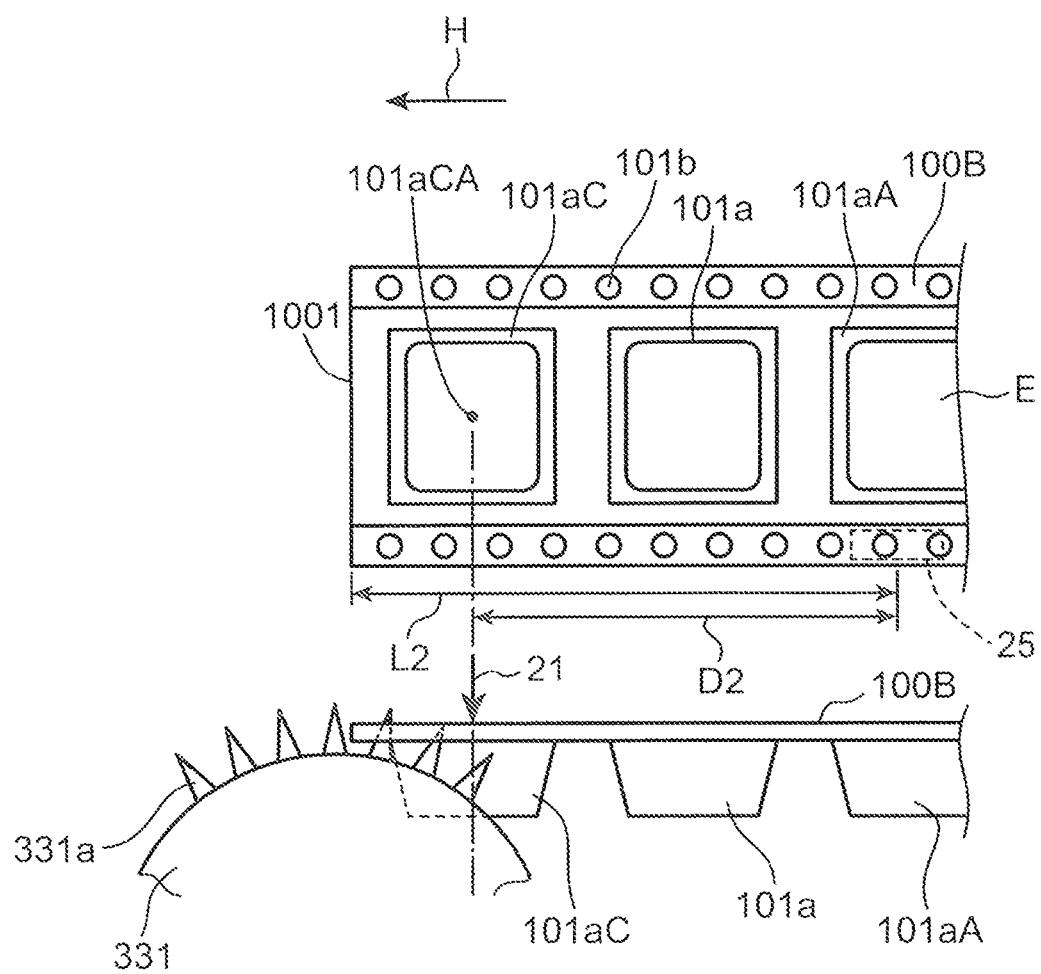

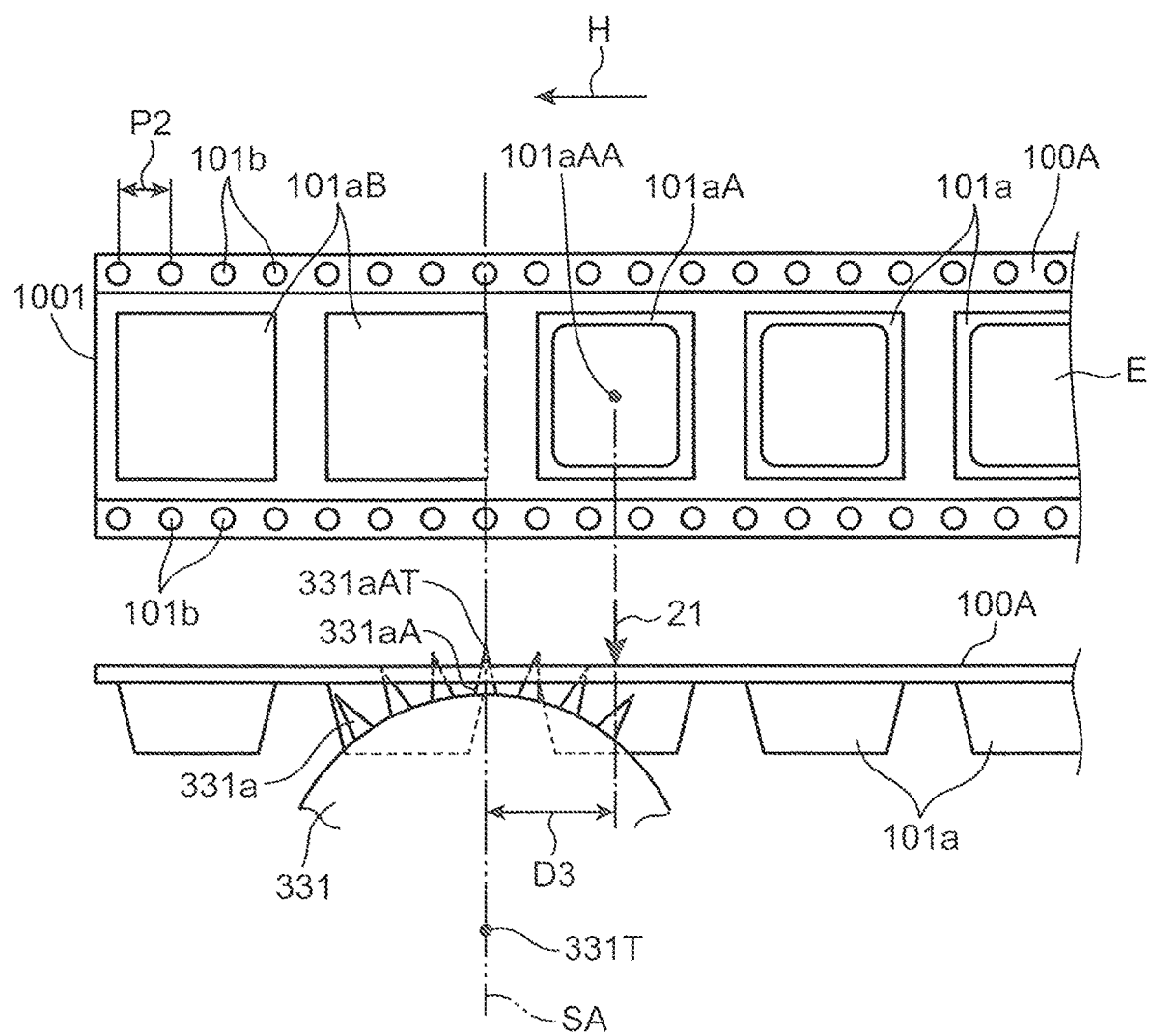

COMPONENT SUPPLY DEVICE AND COMPONENT MOUNTING MACHINE EQUIPPED WITH SAME

CROSS-REFERENCE TO RELATED APPLICATION

This application is a National Stage of International Patent Application No. PCT/JP2017/012171, filed Mar. 24, 2017, the entire content of which is incorporated herein by reference.

BACKGROUND

Technical Field

The present disclosure relates to a component supply device that supplies a component stored in a component storage tape to a component extraction position, and a component mounting machine including the component supply device.

Background Art

A component mounting machine for mounting an electronic component (hereinafter, simply referred to as a "component") on a substrate, such as a printed circuit board, includes a component supply device that supplies the component to a component extraction position. As a component supply device, a device using a component storage tape having a component storage unit in which a component is stored is known. A component supply device of this type is disclosed, for example, in JP 2005-539370 A.

The component supply device disclosed in JP 2005-539370 A includes a first tape feed-out unit and a second tape feed-out unit disposed downstream of the first tape feed-out unit. The first tape feed-out unit feeds a component storage tape introduced through a tape guide in a tape feeding direction. The second tape feed-out unit receives the component storage tape fed out by the first tape feed-out unit, and delivers the component storage tape toward a component extraction position. In this manner, the component supply device can cause a leading component storage unit in which a component is stored to reach the component extraction position so as to supply the component stored in the component storage unit to the component extraction position.

In consideration of extraction property of a component from a component storage unit of a component storage tape by a head unit provided in a component mounting machine, the component storage tape is desirably fed so that the center of the component storage unit coincides with the component extraction position.

A wide variety of component storage tapes having different lengths between centers of adjacent component storage units are used in the component supply device. For this reason, in the component supply device of the prior art, it is difficult for the first tape feed-out unit and the second tape feed-out unit to perform feed-out so that the centers of the component storage units in a wide variety of component storage tapes coincide with the component extraction position. Therefore, in the component supply device of the prior art, in the component storage tape fed out by the first tape feed-out unit and the second tape feed-out unit, there is a case where the center of the component storage unit is shifted in the tape feeding direction with respect to the component extraction position. In such a case, the extraction property of a component from the component storage unit of the component storage tape at the component extraction position is degraded, and supply efficiency of a component by the component supply device is lowered.

SUMMARY

Accordingly, the present disclosure provides a component supply device that supplies a component stored in a component storage tape to a component extraction position, the component supply device capable of providing a component efficiently, and a component mounting machine equipped with the component supply device.

A component supply device according to one aspect of the present disclosure is a component supply device that supplies a component to a component extraction position using a component storage tape in which a plurality of component storage units storing the component are arranged at predetermined intervals. The component supply device includes a first tape feed-out unit that feeds out the component storage tape in a tape feeding direction along an arrangement direction of the component storage units, a second tape feed-out unit that is disposed on a downstream side in the tape feeding direction of the first tape feed-out unit and receives the component storage tape fed out by the first tape feed-out unit to feed out the component storage tape toward the component extraction position, a tape introduction guiding unit that is disposed on an upstream side in the tape feeding direction of the first tape feed-out unit and guides introduction of the component storage tape to the first tape feed-out unit, and a control unit that controls the first tape feed-out unit and the second tape feed-out unit. The tape introduction guiding unit has a mark that is aligned with a center of a standard component storage unit in the component storage tape when the component storage tape is introduced to the first tape feed-out unit, the control unit includes a first tape feed-out control unit that controls the first tape feed-out unit to feed out the component storage tape when the component storage tape is introduced to the first tape feed-out unit through the tape introduction guiding unit, a first calculation unit that calculates a standard tape length indicating a length from a tip of the component storage tape fed out by the first tape feed-out unit to a center of the standard component storage unit, a second calculation unit that calculates, based on the standard tape length, a target feed-out length of the component storage tape to be fed out by the second tape feed-out unit so that a center of a leading component storage unit in which a component in the component storage tape is stored coincides with the component extraction position, and a second tape feed-out control unit that controls the second tape feed-out unit so that the component storage tape is fed out based on the target feed-out length when a tip of the component storage tape fed out by the first tape feed-out unit reaches the second tape feed-out unit.

A component mounting machine according to another aspect of the present disclosure includes the component supply device, and a head unit that takes out a component supplied to the component extraction position by the component supply device.

An object, a feature, and an advantage of the present disclosure will become clearer by detailed description below and the accompanying drawings.

BRIEF DESCRIPTION OF THE DRAWINGS

FIG. 3 is a diagram showing a configuration of a component storage tape used in the component supply device;

FIG. 14A is a diagram for describing loading operation in a case where the first component storage tape is introduced to a first tape feed-out unit through the tape introduction guiding unit;

FIG. 14B is a diagram for describing loading operation in a case where the second component storage tape is introduced to the first tape feed-out unit through the tape introduction guiding unit;

FIG. 15B is a diagram for describing loading operation in a case of using the second component storage tape; and FIG. 16 is a diagram for describing operation of a third tape feed-out unit at the time of the loading operation.

DETAILED DESCRIPTION

Hereinafter, a component supply device and a component mounting machine according to an embodiment of the present disclosure will be described based on the drawings. Note that, hereinafter, a directional relationship will be described using XYZ orthogonal coordinate axes. The left-right direction is taken as the X-axis direction, the front-back direction orthogonal to the X-axis direction is taken as the Y-axis direction, and the up-down direction orthogonal to both the X-axis direction and the Y-axis direction is taken as the Z-axis direction. Further, the left direction which is one direction in the X-axis direction is referred to as "+X direction", and the right direction which is the other direction opposite to the one direction in the X-axis direction is referred to as "−X direction". Further, the forward direction which is one direction in the Y-axis direction is referred to as "+Y direction", and the rear direction which is the other direction opposite to the one direction in the Y-axis direction is referred to as "−Y direction". Further, the downward direction which is one direction in the Z-axis direction is referred to as "−Z direction", and the upward direction which is the other direction opposite to the one direction in the Z-axis direction is referred to as "+Z direction".

[Configuration of Component Mounting Machine]

Figure 1:
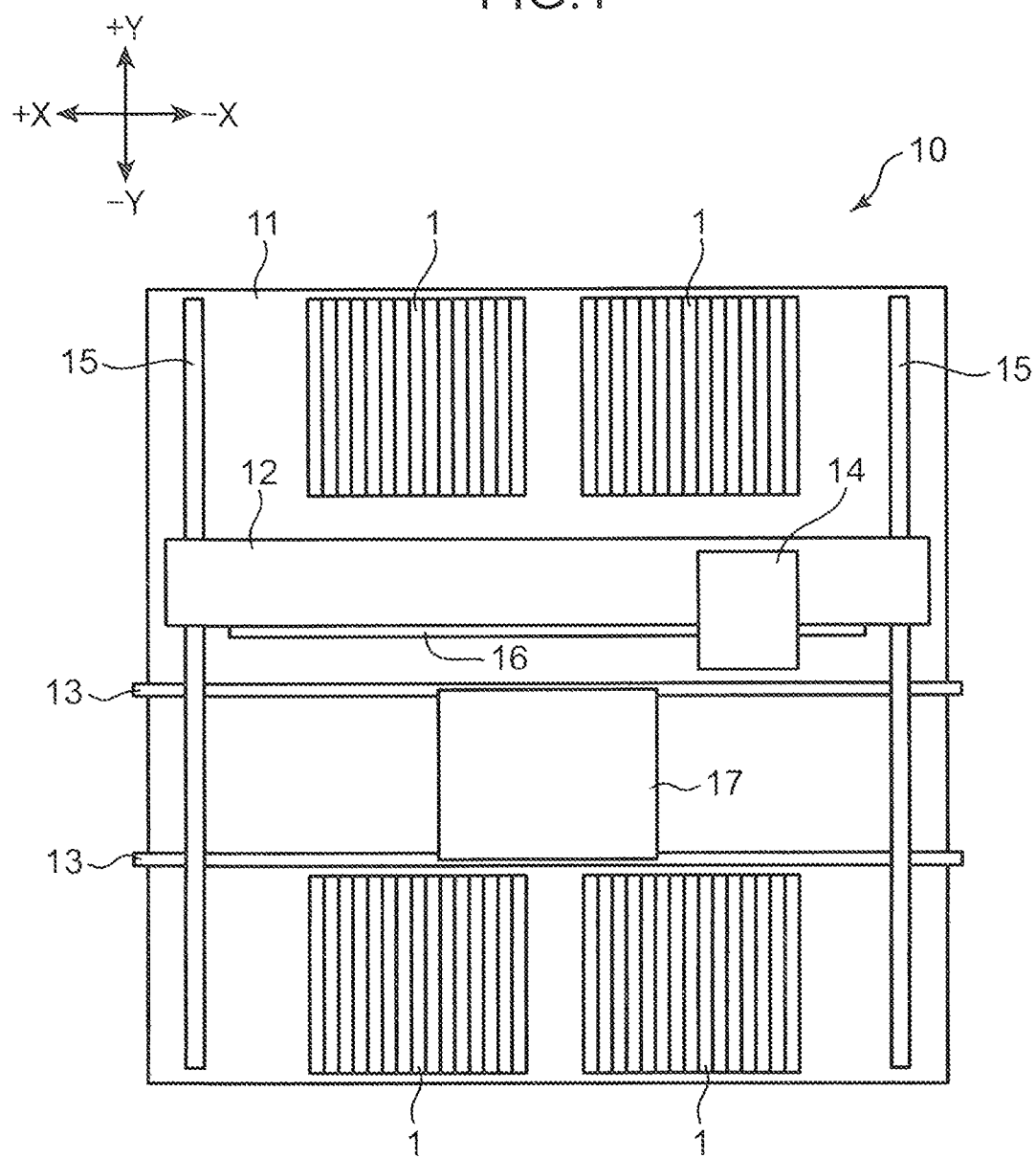
FIG. 1 is a diagram schematically showing a configuration of a component mounting machine including a component supply device according to an embodiment of the present disclosure.

FIG. 1 is a diagram schematically showing a configuration of a component mounting machine 10 including a component supply device 1 according to an embodiment of the present disclosure. The component mounting machine 10 is a device for mounting a component on a substrate 17 to produce a mounted substrate. The component mounting machine 10 includes the component supply device 1, a main body frame 11, a moving frame 12, a conveyor 13, a head unit 14, a first drive mechanism 15, and a second drive mechanism 16.

The main body frame 11 is a structure in which each part constituting the component mounting machine 10 is disposed, and is formed in a substantially rectangular shape in a plan view as viewed from a direction orthogonal to both the X-axis direction and the Y-axis direction. The conveyor 13 extends in the X-axis direction and is disposed on the main body frame 11. The conveyor 13 conveys the substrate 17 in the X-axis direction. The substrate 17 is conveyed on the conveyor 13 and positioned at a predetermined work position (a mounting position where a component is mounted on the substrate 17).

The component supply devices 1 are disposed on both sides of the conveyor 13 in the Y-axis direction. The component supply device 1 supplies a component to a component extraction position using a component storage tape. The component supplied to the component extraction position by the component supply device 1 is extracted by the head unit 14. Details of the component supply device 1 will be described later.

The moving frame 12 extends in the X-axis direction, and is supported by the main body frame 11 so as to be movable in a predetermined moving direction (Y-axis direction). The head unit 14 is mounted on the moving frame 12. The head unit 14 is mounted on the moving frame 12 so as to be movable in the X-axis direction. That is, the head unit 14 is movable in the Y-axis direction along with the movement of the moving frame 12 and movable in the X-axis direction along the moving frame 12. The head unit 14, which is movable between the component supply device 1 and a predetermined work position of the substrate 17 conveyed by the conveyor 13, extracts a component supplied to the component extraction position by the component supply device 1 and mounts the extracted component on the substrate 17.

The head unit 14 includes a plurality of mounting heads each provided with a nozzle for component suction at its tip, and a head drive mechanism using a servomotor as a drive source that causes these mounting heads to move up and down (move in the Z-axis direction) with respect to the head unit 14 and rotates the mounting heads around a nozzle center axis. The nozzle of each of the mounting heads can communicate with any of a negative pressure generating device, a positive pressure generating device, and the atmosphere via an electric switching valve. That is, suctioning and holding of a component (extraction of a component) by the nozzle is made possible by supply of negative pressure to the nozzle, and thereafter, the suctioning and holding of the component is released by supply of positive pressure.

The first drive mechanism 15 is provided at ends of the main body frame 11 on the +X direction side and the −X direction side. The first drive mechanism 15 is a mechanism that moves the moving frame 12 in the Y-axis direction. The first drive mechanism 15 includes, for example, a drive motor, a ball screw shaft extending in the Y-axis direction and coupled to the drive motor, and a ball nut provided on the moving frame 12 and screwed to the ball screw shaft. The first drive mechanism 15 having such a configuration moves the moving frame 12 in the Y-axis direction as a ball nut advances and retreats along the ball screw shaft in accordance with rotational drive of the ball screw shaft by the drive motor.

The second drive mechanism 16 is provided on the moving frame 12. The second drive mechanism 16 is a mechanism for moving the head unit 14 in the X-axis direction along the moving frame 12. Similar to the first drive mechanism 15, the second drive mechanism 16 includes, for example, a drive motor, a ball screw shaft extending in the X-axis direction and coupled to the drive motor, and a ball nut provided on the head unit 14 and screwed to the ball screw shaft. The second drive mechanism 16 having such a configuration moves the head unit 14 in the X-axis direction as the ball nut advances and retreats along the ball screw shaft in accordance with the rotational drive of the ball screw shaft by the drive motor.

[Configuration of Component Supply Device]

Figure 2:
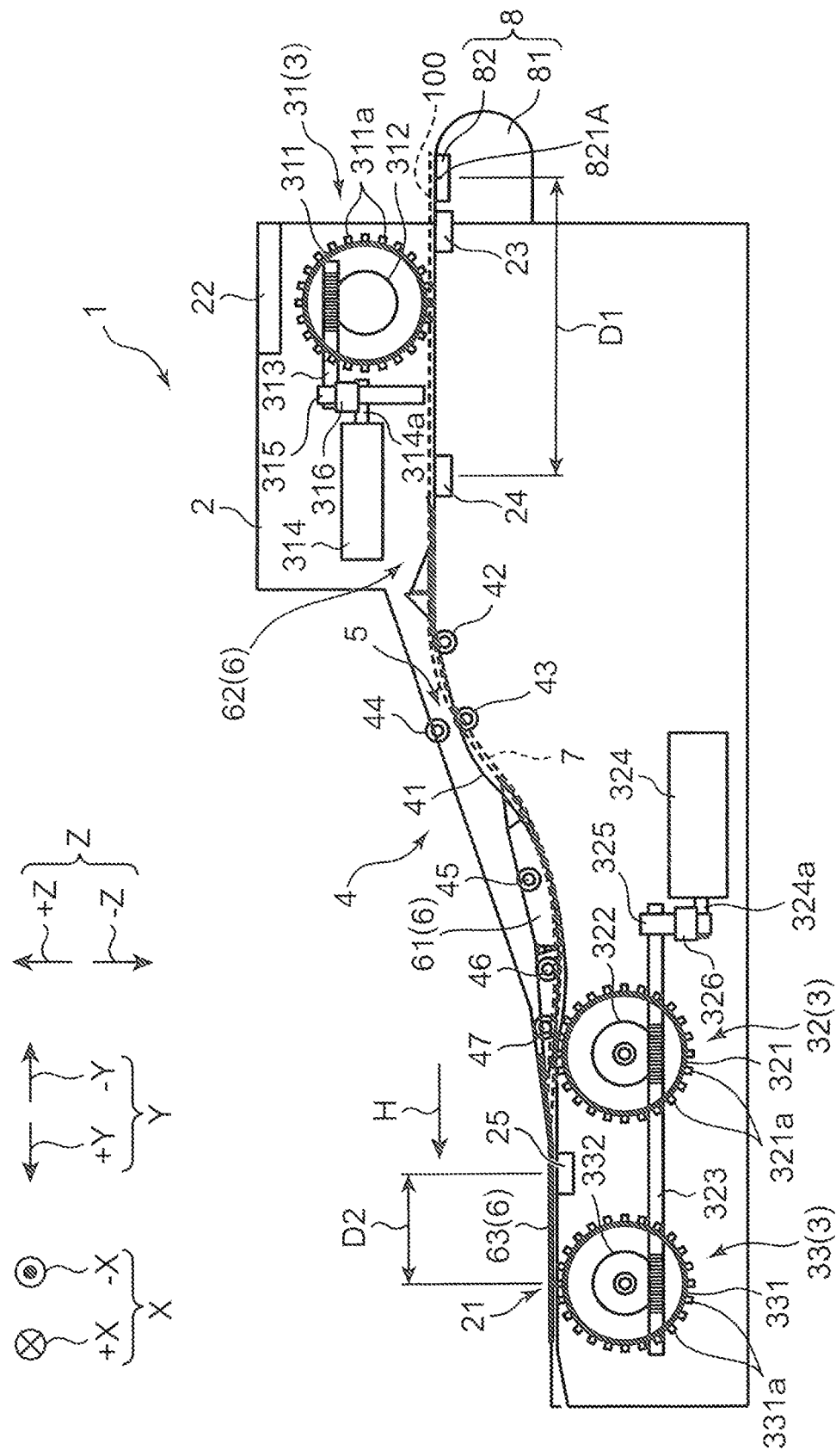
FIG. 2 is a diagram schematically showing a configuration of a component supply device.

FIG. 2 is a diagram schematically showing a configuration of the component supply device 1. The component supply device 1 is a device for supplying a component stored in a component storage tape 100 to a component extraction position 21. A component supplied to the component extraction position 21 by the component supply device 1 is extracted from the component storage tape 100 by the head unit 14 included in the component mounting machine 10, and then mounted on the substrate 17. Prior to description of the configuration of the component supply device 1, the component storage tape 100 will be described with reference to FIG. 3. FIG. 3 is a diagram illustrating a configuration of the component storage tape 100 used in the component supply device 1.

The component storage tape 100 includes a carrier tape 101 and a cover tape 102. The carrier tape 101 is a tape on which a plurality of component storage units 101*a* for storing a component E are arranged at predetermined intervals. Further, on both ends in a width direction of the carrier tape 101, holes 101*b*, which are fitted to a tooth portion of a first sprocket 311, a second sprocket 321, and a third sprocket 331 in a tape feed-out unit 3 described later and used by the tape feed-out unit 3 to feed out the component storage tape 100, are arranged at predetermined intervals. Note that the description "the holes 101*b* of the component storage tape 100 are fitted to a tooth portion of the first sprocket 311, the second sprocket 321, and the third sprocket 331" means that the tooth portion fits into the hole 101*b*, so that the component storage tape 100 interlocked with the rotation of the first sprocket 311, the second sprocket 321, and the third sprocket 331 can be fed.

The cover tape 102 is a tape to which the carrier tape 101 is attached so as to cover the component storage unit 101*a*. The cover tape 102 is attached to the carrier tape 101 by both ends in the width direction of the cover tape 102 being melted. For this reason, in the component storage tape 100, a fusion portion 103 obtained by melting of the cover tape 102 is formed linearly along an inner edge side of the cover tape 102 in the width direction at both ends in the width direction on the upper surface of the carrier tape 101. In the width direction of the carrier tape 101, the fusion portion 103 is provided on the inner side than the hole 101*b*.

In the component storage tape 100 configured as described above, a length K1 between the fusion portions 103 formed at both ends in the width direction of the carrier tape 101 along the inner edge of the cover tape 102 in the width direction is substantially equal to the length of the cover tape 102 in the width direction. Further, a length K2 in the width direction of the component storage tape 100 is the same as the length in the width direction of the carrier tape 101. Note that the component storage tape 100 is a wide tape whose length K2 in the width direction is 32 mm or more.

As shown in FIG. 2, the component supply device 1 includes a device main body 2, the tape feed-out unit 3, a tape traveling path forming unit 4, a component exposure unit 6, a lid member 7, and a tape introduction guiding unit 8. The device main body 2 is a housing that accommodates each part constituting the component supply device 1. An operation unit 22 is attached to the device main body 2. The operation unit 22 is a portion where an instruction for operating the component supply device 1 is input by the operator.

Figure 4:
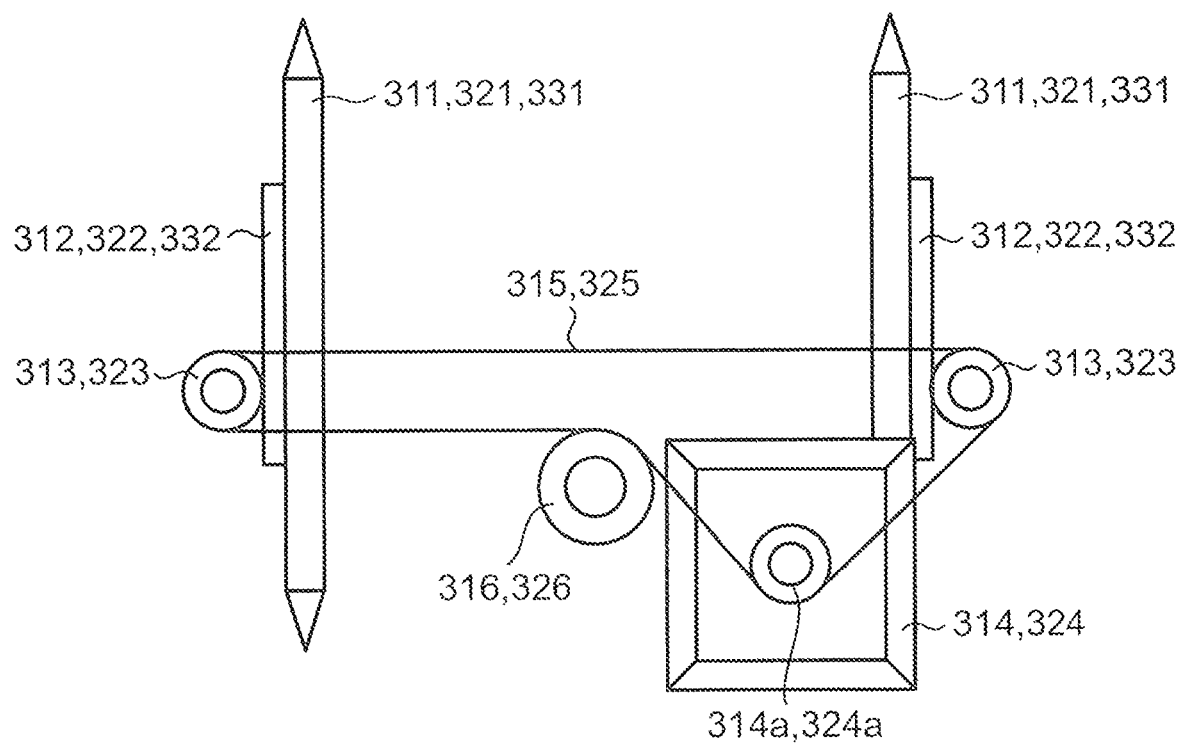
FIG. 4 is a diagram of a tape feed-out unit included in the component supply device as viewed from a tape feeding direction.
Figure 5:
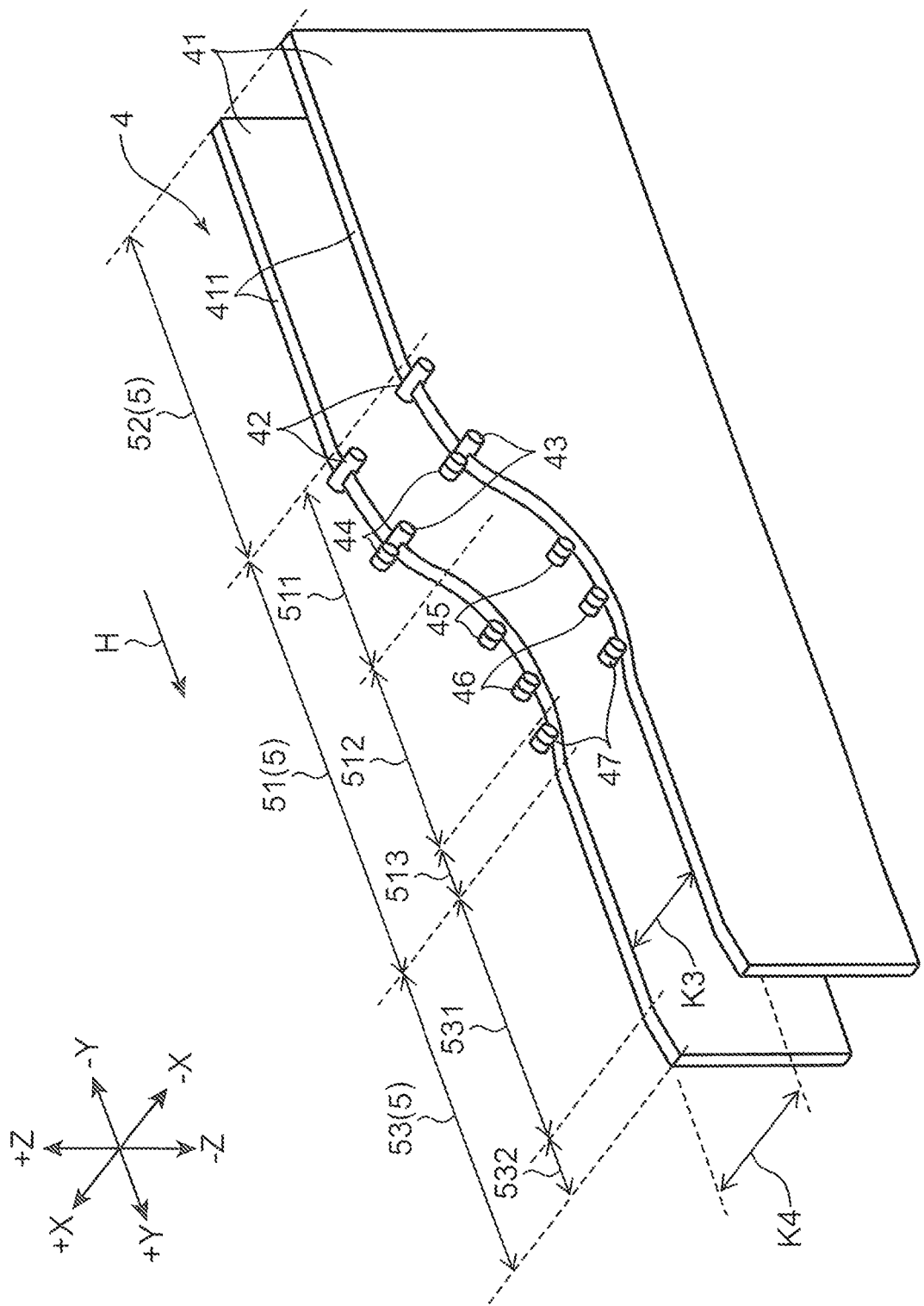
FIG. 5 is a diagram illustrating a configuration of a tape traveling path forming unit provided in the component supply device.
Figure 6:
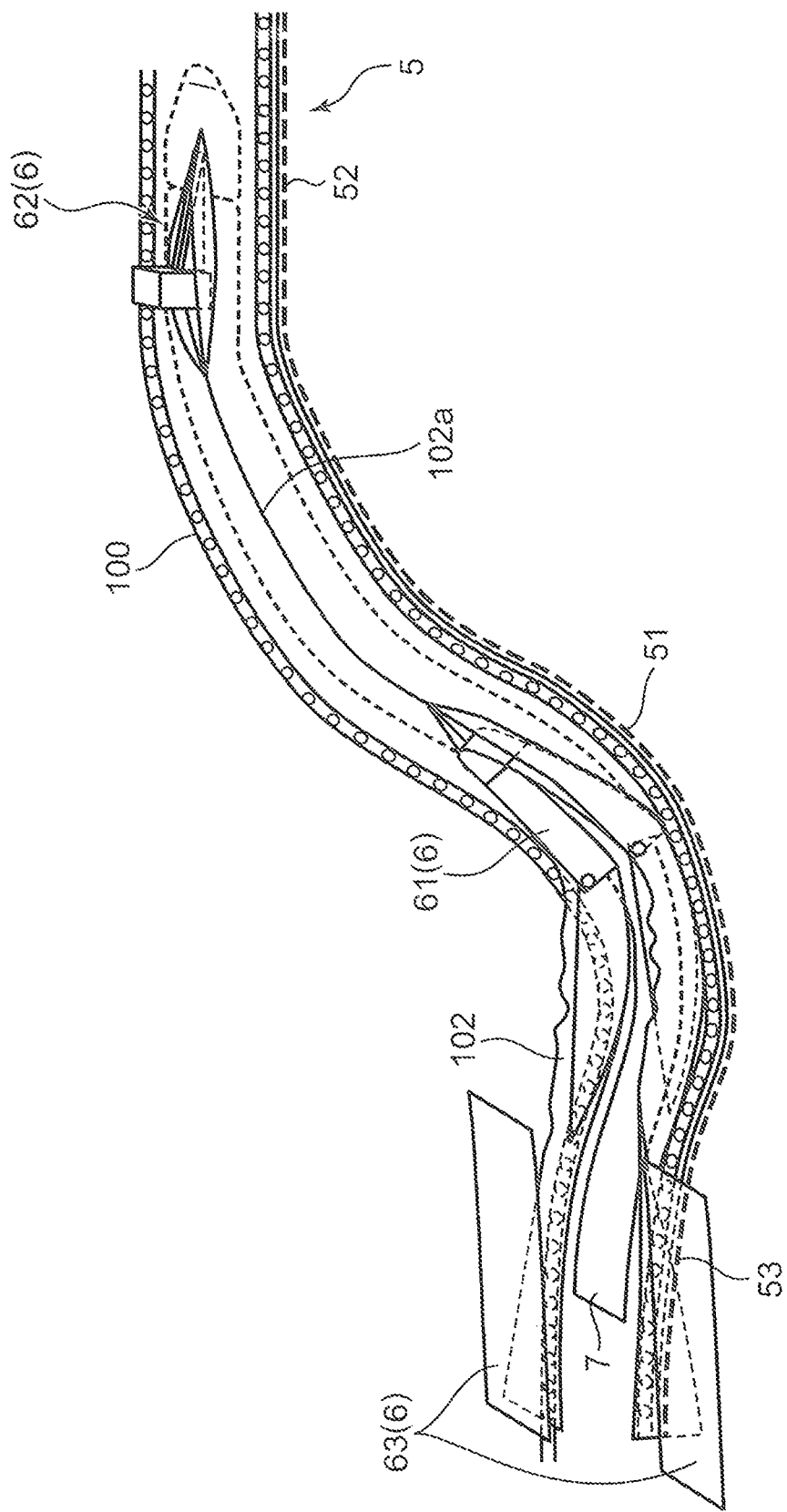
FIG. 6 is a diagram illustrating a configuration of a component exposure unit included in the component supply device.

FIG. 4 is a diagram schematically illustrating a configuration of the tape feed-out unit 3 provided in the component supply device 1, as viewed from a tape feeding direction H. FIG. 5 is a diagram illustrating a configuration of the tape traveling path forming unit 4 provided in the component supply device 1. FIG. 6 is a diagram illustrating a configuration of the component exposure unit 6 provided in the component supply device 1.

The tape feed-out unit 3 feeds out the component storage tape 100 toward the component extraction position 21 in the predetermined tape feeding direction H along the arrangement direction of the component storage unit 101*a*. The tape feeding direction H in which the tape feed-out unit 3 feeds out the component storage tape 100 toward the component extraction position 21 coincides with the +Y direction. The tape feed-out unit 3 executes a first feed-out operation (hereinafter referred to as a "first loading operation") for feeding out the component storage tape 100 introduced through the tape introduction guiding unit 8 described later, and a second feed-out operation (second loading operation) of intermittently feeding the component storage tape 100 in the tape feeding direction H so that the component storage units 101*a* reach the component extraction position 21 one by one at predetermined time intervals after the first loading operation. Note that the tape feed-out unit 3 is configured to be able to execute a loading operation of feeding out the component storage tape 100 in the tape feeding direction H toward the component extraction position 21, and an unloading operation of feeding out the component storage tape 100 in the −Y direction opposite to the tape feeding direction H. Details of the first loading operation executed by the tape feed-out unit 3 will be described later.

The tape traveling path forming unit 4 forms a traveling path 5 leading to the component extraction position 21 for the component storage tape 100 fed out by the tape feed-out unit 3. As shown in FIGS. 2 and 5, the tape traveling path forming unit 4 includes a pair of guide walls 41 and first to sixth guide rollers 42, 43, 44, 45, 46, and 47 which are a plurality of guide rollers.

The pair of guide walls 41 are a pair of wall portions disposed in the device main body 2 so as to face each other at predetermined intervals in the X-axis direction and extending in the Y-axis direction. The component storage tape 100 fed out by the tape feed-out unit 3 has both ends in the X-axis direction on a surface (lower surface) on the −Z direction side guided by end surfaces 411 (hereinafter referred to as "guide surfaces 411") on the +Z direction side of the pair of guide walls 41. That is, the traveling path 5 is formed along the guide surfaces 411 of the pair of guide walls 41. Note that the pair of guide walls 41 are notched in a region portion where a pair of second sprockets 321 of a second tape feed-out unit 32 and a pair of third sprockets 331 of a third tape feed-out unit 33 in the tape feed-out unit 3 described later are disposed.

A distance K3 between inner surfaces of the pair of guide walls 41 facing each other is set to be substantially equal to the length K1 between the fusion portions 103 on the component storage tape 100. Further, a distance K4 between outer surfaces of the pair of guide walls 41 is set to be substantially equal to the length K2 in the width direction of the component storage tape 100. The distance K4 is a length in the width direction (X-axis direction) of the traveling path 5.

The traveling path 5 formed along the guide surfaces 411 of the pair of guide walls 41 includes a first path portion 51, a second path portion 52, and a third path portion 53, as shown in FIG. 5. The first path portion 51 in the traveling path 5 is a path formed of a slope section which is inclined to one direction side in the Z-axis direction (the −Z direction side) orthogonal to the width direction (X-axis direction) of the traveling path 5 and the tape feeding direction H, from an upstream side to a downstream side in the tape feeding direction H. The first path portion 51 includes a first region 511 on the most upstream side in the tape feeding direction H, a second region 512 continuous to the downstream side in the tape feeding direction H of the first region 511, and a third region 513 continuous to the downstream side in the tape feeding direction H of the second region 512. The first region 511 of the first path portion 51 is formed in a convex shape in the +Z direction (upward direction) when viewed from the width direction (X-axis direction) of the traveling path 5. The second region 512 of the first path portion 51 is formed in a convex shape in the −Z direction (downward direction) when viewed from the width direction (X-axis direction) of the traveling path 5.

The second path portion 52 in the traveling path 5 is a path continuous to the upstream side in the tape feeding direction H of the first path portion 51. In the present embodiment, the second path portion 52 is formed to horizontally extend from the upstream side to the downstream side in the tape feeding direction H.

The third path portion 53 in the traveling path 5 is a path that is continuous the downstream side in the tape feeding direction H of the first path portion 51 and reaches the component extraction position 21. In the present embodiment, the third path portion 53 has a horizontal region 531 and an inclined region 532. The horizontal region 531 is a region portion that is continuous to the third region 513 of the first path portion 51 and extends horizontally along the tape feeding direction H. A downstream end in the tape feeding direction H of the horizontal region 531 in the third path portion 53 coincides with the component extraction position 21 in the tape feeding direction H. As described above, by employing the configuration in which the component extraction position 21 is positioned in the horizontal region 531 which is a horizontal region portion in the third path portion 53, accuracy of extracting the component E from the component storage tape 100 at the component extraction position 21 is improved. Note that the inclined region 532 is a region portion that is continuous to the downstream side in the tape feeding direction H of the horizontal region 531 and inclined downward at a front portion.

The first to sixth guide rollers 42, 43, 44, 45, 46, and 47 constituting the tape traveling path forming unit 4 are a pair of rollers separated from each other in the X-axis direction, and are configured to be rotatable around an axial center extending in the X-axis direction. The first to sixth guide rollers 42, 43, 44, 45, 46, and 47 together with the guide surfaces 411 of the pair of guide walls 41 form the first path portion 51 in the traveling path 5.

The first guide roller 42 is disposed at an upstream end in the tape feeding direction H of the first region 511 of the first path portion 51. The first guide roller 42 slightly protrudes on the +Z direction side (upper side) from the guide surfaces 411 of the pair of guide walls 41. The first guide roller 42 guides both ends in the X-axis direction on a surface (lower surface) on the −Z direction side of the component storage tape 100 fed out by the tape feed-out unit 3.

The second guide roller 43 is disposed downstream of the first guide roller 42 in the tape feeding direction H in the first region 511 of the first path portion 51. The second guide roller 43 slightly protrudes on the +Z direction side (upper side) from the guide surfaces 411 of the pair of guide walls 41. The second guide roller 43 guides both ends in the X-axis direction on the surface (lower surface) on the −Z direction side of the component storage tape 100 fed out by the tape feed-out unit 3.

The third guide roller 44 is disposed in the first region 511 of the first path portion 51 so as to face the second guide roller 43. The third guide roller 44 guides both ends in the X-axis direction on a surface (upper surface) on the +Z direction side of the component storage tape 100 fed out by the tape feed-out unit 3.

The fourth guide roller 45 is disposed in the second region 512 of the first path portion 51 so as to face the guide surfaces 411 of the pair of guide walls 41. The fourth guide roller 45 guides both ends in the X-axis direction on the surface (upper surface) on the +Z direction side of the component storage tape 100 fed out by the tape feed-out unit 3.

The fifth guide roller 46 is disposed downstream of the fourth guide roller 45 in the tape feeding direction H in the second region 512 of the first path portion 51 so as to face the guide surfaces 411 of the pair of guide walls 41. The fifth guide roller 46 guides both ends in the X-axis direction on the surface (upper surface) on the +Z direction side of the component storage tape 100 fed out by the tape feed-out unit 3.

The sixth guide roller 47 is disposed in the third region 513 of the first path portion 51 so as to face the guide surfaces 411 of the pair of guide walls 41. The sixth guide roller 47 guides both ends in the X-axis direction on the surface (upper surface) on the +Z direction side of the component storage tape 100 fed out by the tape feed-out unit 3.

As described above, since the first to sixth guide rollers 42, 43, 44, 45, 46, and 47 are configured to be rotatable about an axis extending in the X-axis direction, a frictional force generated when the component storage tape 100 fed out by the tape feed-out unit 3 is guided can be reduced. For this reason, it is possible to reduce travel resistance when the component storage tape 100 travels on the first path portion 51 formed by the first to sixth guide rollers 42, 43, 44, 45, 46, and 47 and the guide surfaces 411 of the pair of guide walls 41.

Note that, although the tape traveling path forming unit 4 configured by the first to sixth guide rollers 42, 43, 44, 45, 46, and 47 and the pair of guide walls 41 has been described, the tape traveling path forming unit 4 is not limited to such a configuration. For example, the tape traveling path forming unit 4 may have a configuration in which a plurality of roller pairs facing in the Z-axis direction are arranged.

A configuration of the tape feed-out unit 3 will be specifically described with reference to FIGS. 2 and 4. The tape feed-out unit 3 includes a first tape feed-out unit 31, a second tape feed-out unit 32, and a third tape feed-out unit 33.

The first tape feed-out unit 31 is disposed at the upstream end in the tape feeding direction H of the second path portion 52 in the traveling path 5. The first tape feed-out unit 31 feeds out the component storage tape 100 in a state where the tip is a free end, so as to cause the component storage tape 100 to travel in the second path portion 52 and the first path portion 51. The first tape feed-out unit 31 includes a pair of first sprockets 311, a pair of first worm wheels 312, a pair of first worms 313, a first servomotor 314, a first belt 315, and a first stretching roller 316.

The pair of first sprockets 311 are disk-shaped sprockets rotatably supported by the device main body 2 about an axis extending in the X-axis direction (tape width direction). The pair of first sprockets 311 include a plurality of tooth portions 311a arranged at predetermined intervals in a circumferential direction. The tooth portions 311a of the pair of first sprockets 311 can be fitted to the holes 101b formed at both ends in the width direction of the carrier tape 101 of the component storage tape 100. Further, the pair of first sprockets 311 incorporate a one-way clutch that transmits a rotational force only in one direction.

Each of the pair of first worm wheels 312 is a worm gear provided coaxially with each of the pair of first sprockets 311. Each of the pair of first worms 313 is a screw gear that meshes with each of the pair of first worm wheels 312.

The first servomotor 314 is a drive source that generates a driving force for rotating the pair of first sprockets 311. The first servomotor 314 has a motor output shaft 314a for outputting a driving force. The first belt 315 is an endless belt, is stretched between the motor output shaft 314a and the pair of first worms 313, and travels in a circular motion by rotational drive of the first servomotor 314. The first stretching roller 316 is a roller that abuts on an outer circumferential surface of the first belt 315 and applies tension to the first belt 315.

In the first tape feed-out unit 31 configured as described above, the rotational driving force of the first servomotor 314 is transmitted to the pair of first worm wheels 312 via the first belt 315 and the pair of first worms 313, and thus, the pair of first worm wheels 312 rotate. When the pair of first worm wheels 312 rotate, the pair of first sprockets 311 rotate in conjunction with the rotation. When the pair of first sprockets 311 rotate, the component storage tape 100 including the carrier tape 101 having the holes 101b fitted to the tooth portion 311a of the first sprocket 311 is fed.

The second tape feed-out unit 32 is disposed on a downstream side in the tape feeding direction H of the first tape feed-out unit 31. The second tape feed-out unit 32 is disposed at the downstream end in the tape feeding direction H of the first path portion 51 in the traveling path 5, in other words, at the upstream end in the tape feeding direction H of the third path portion 53. The second tape feed-out unit 32 receives the component storage tape 100 which is fed out by the first tape feed-out unit 31 and travels in the first path portion 51, and feeds out the component storage tape 100 toward the component extraction position 21. In this manner, the second tape feed-out unit 32 causes the component storage tape 100 to travel in the third path portion 53.

Similar to the first tape feed-out unit 31, the second tape feed-out unit 32 includes a pair of second sprockets 321, a pair of second worm wheels 322, a pair of second worms 323, a second servomotor 324, a second belt 325, and a second stretching roller 326.

The pair of second sprockets 321 are disk-shaped sprockets rotatably supported by the device main body 2 about an axis extending in the X-axis direction (tape width direction). The pair of second sprockets 321 include a plurality of tooth portions 321a arranged at predetermined intervals in the circumferential direction. In the pair of second sprockets 321, the tooth portions 321a located on the other side (the +Z direction side) in the Z-axis direction are exposed from the guide surfaces 411 of the pair of guide walls 41. The tooth portions 321a of the pair of second sprockets 321 can be fitted to the holes 101b formed at both ends in the width direction of the carrier tape 101 of the component storage tape 100.

Each of the pair of second worm wheels 322 is a worm gear provided coaxially with each of the pair of second sprockets 321. Each of the pair of second worms 323 is a screw gear that meshes with each of the pair of second worm wheels 322.

The second servomotor 324 is a drive source that generates a driving force for rotating the pair of second sprockets 321. The second servomotor 324 has a motor output shaft 324a for outputting a driving force. The second belt 325 is an endless belt, is stretched between the motor output shaft 324a and the pair of second worms 323, and travels in a circular motion by rotational drive of the second servomotor 324. The second stretching roller 326 is a roller that abuts on an outer circumferential surface of the second belt 325 and applies tension to the second belt 325.

In the second tape feed-out unit 32 configured as described above, the rotational driving force of the second servomotor 324 is transmitted to the pair of second worm wheels 322 via the second belt 325 and the pair of second worms 323, and thus, the pair of second worm wheels 322 rotate. When the pair of second worm wheels 322 rotate, the pair of second sprockets 321 rotate in conjunction with the rotation. When a pair of second sprockets 321 rotate, the component storage tape 100 including the carrier tape 101 having the holes 101b fitted to the tooth portion 321a of the second sprocket 321 is fed.

Note that when a tip portion of the component storage tape 100 fed out by the first tape feed-out unit 31 reaches the pair of second sprockets 321, and the hole 101b of the carrier tape 101 at the tip portion of the component storage tape 100 is fitted to the tooth portion 321a of the pair of second sprockets 321, the first servomotor 314 stops. When the first servomotor 314 stops as described above, a rotation shaft of the first sprocket 311 stops. However, even if the rotation shaft does not rotate, since the one-way clutch interposed between the rotation shaft and the first sprocket 311, the first sprocket 311 can rotate in conjunction with the movement of the component storage tape 100 fed out by the rotation of the pair of second sprockets 321.

The third tape feed-out unit 33 is disposed at the downstream end in the tape feeding direction H of the horizontal region 531 in the third path portion 53 of the traveling path 5. That is, the third tape feed-out unit 33 is provided close to the component extraction position 21 on the downstream side in the tape feeding direction H of the second tape feed-out unit 32. The third tape feed-out unit 33 feeds out the component storage tape 100 in conjunction with the second tape feed-out unit 32. The third tape feed-out unit 33 receives the component storage tape 100 which is fed out by the second tape feed-out unit 32 and travels in the third path portion 53, and feeds out the component storage tape 100 so that the component storage tape 100 passes through the component extraction position 21. By the configuration in which the third tape feed-out unit 33 is provided close to the component extraction position 21 and the third tape feed-out unit 33 receives the component storage tape 100, the component storage tape 100 can be fed out in a state of being positioned at the component extraction position 21 with high accuracy.

The third tape feed-out unit 33 includes a pair of third sprockets 331 and a pair of third worm wheels 332. The above description "the third tape feed-out unit 33 is provided close to the component extraction position 21" means that the third tape feed-out unit 33 is disposed so that the component extraction position 21 is located within a range of the pair of third sprocket 331 in the tape feeding direction H when viewed from the width direction (X-axis direction) of the traveling path 5. When viewed from the width direction (X-axis direction) of the traveling path 5, the component extraction position 21 may be directly above the top (uppermost end) of the pair of third sprockets 331, or may be located at a position shifted in the Y-axis direction from directly above the pair of third sprockets 331. In a case where the component extraction position 21 is located at a position shifted in the Y-axis direction from directly above the top of the pair of third sprockets 331, the position is preferably shifted to the upstream side relative to the downstream side in the tape feeding direction H. This is because, since a region portion, which passes through the component extraction position 21, of the component storage tape 100 fed out by the pair of third sprockets 331 of the third tape feed-out unit 33 is in a state of being pulled, the region portion is hardly deformed, and is in a state of being positioned with high accuracy with respect to the component extraction position 21.

The pair of third sprockets 331 are disk-shaped sprockets rotatably supported by the device main body 2 about an axis extending in the X-axis direction (tape width direction). The pair of third sprockets 331 include a plurality of tooth portions 331a arranged at predetermined intervals in the circumferential direction. In the pair of third sprockets 331, the tooth portions 331a located on the other side (the +Z direction side) in the Z-axis direction are exposed from the guide surfaces 411 of the pair of guide walls 41. The tooth portions 331a of the pair of third sprockets 331 can be fitted to the holes 101b formed at both ends in the width direction of the carrier tape 101 of the component storage tape 100.

Each of the pair of third worm wheels 332 is a worm gear provided coaxially with each of the pair of third sprockets 331. Each of the pair of third worm wheels 332 meshes with each of the pair of second worms 323.

In the third tape feed-out unit 33 configured as described above, similar to the second tape feed-out unit 32, the rotational driving force of the second servomotor 324 is transmitted to the pair of third worm wheels 332 via the second belt 325 and the pair of second worms 323, and thus, the pair of third worm wheels 332 rotate. When the pair of third worm wheels 332 rotate, the pair of third sprockets 331 rotate in conjunction with the rotation. When the pair of third sprockets 331 rotate, the component storage tape 100 including the carrier tape 101 having the holes 101b fitted to the tooth portion 331a of the third sprocket 331 is fed.

Next, with reference to FIG. 6, a configuration of the component exposure unit 6 provided in the component supply device 1 will be described. The component exposure unit 6 is disposed on the traveling path 5 formed by the tape traveling path forming unit 4. The component exposure unit 6 exposes the component E in the component storage unit 101a of the component storage tape 100 which is fed out by the tape feed-out unit 3 and travels in the traveling path 5. The component exposure unit 6 includes a cover tape raising unit 61, a cover tape pre-processing unit 62, and a cover tape post-processing unit 63.

Figure 7:
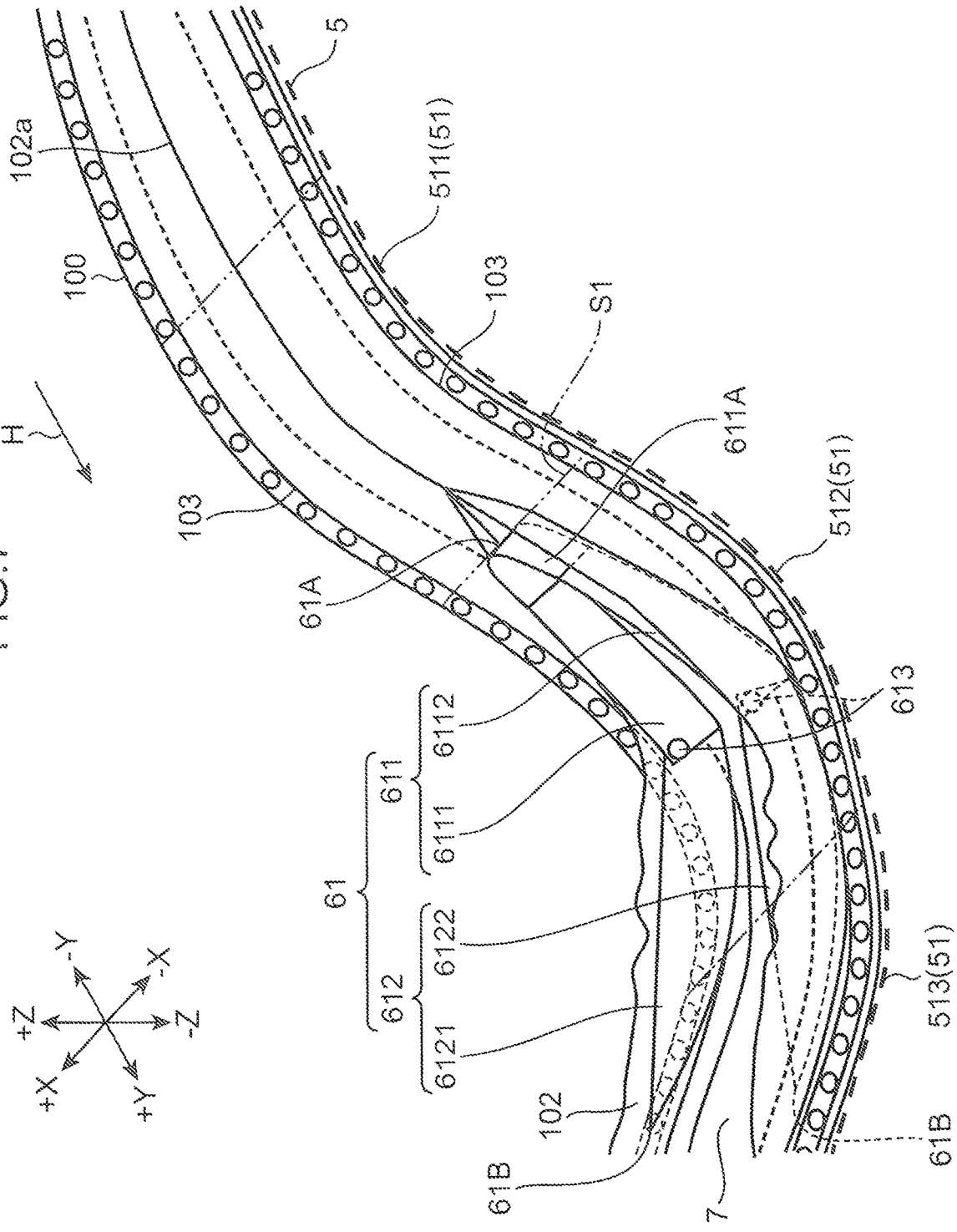
FIG. 7 is a diagram illustrating a configuration of a cover tape raising unit in the component exposure unit.

FIG. 7 is a diagram illustrating a configuration of the cover tape raising unit 61 in the component exposure unit 6. The cover tape raising unit 61 is disposed in the first path portion 51 on the traveling path 5. The cover tape raising unit 61 abuts on the cover tape 102 of the component storage tape 100 traveling the first path portion 51 in the traveling path 5, so as to perform raising processing of raising the cover tape 102 toward the +Z direction side (upward side) with respect to the carrier tape 101. The component E is exposed in the component storage unit 101a of the component storage tape 100 by the raising processing for the cover tape 102 performed by the cover tape raising unit 61.

In the present embodiment, the cover tape raising unit 61 abuts on a cut portion 102a of the cover tape 102 cut by a cover tape cutting portion 622 included in the cover tape pre-processing unit 62 described later, and performs the raising processing for the cut cover tape 102. Note that the cover tape cutting portion 622 of the cover tape pre-processing unit 62 cuts a predetermined position (for example, a central position) between both ends in the width direction of the cover tape 102. Further, the cut portion 102a of the cover tape 102 cut by the cover tape cutting portion 622 linearly extends along the traveling path 5.

The cover tape raising unit 61 includes a raising region expanding unit 611 and a raising region holding unit 612.

The raising region expanding unit 611 is a region portion on the upstream side in the tape feeding direction H of the cover tape raising unit 61. A tip of an upstream end portion 611A in the tape feeding direction H of the raising region expanding unit 611 is a most upstream end 61A of the cover tape raising unit 61, and is a starting point of abutting on the cover tape 102. The raising region expanding unit 611 expands a raising region of the cover tape 102 on the +Z direction side (upward side) with respect to the carrier tape 101 to a range from the raising starting point to the fusion portion 103. Note that the raising starting point of the cover tape 102 is the starting point of abutting of the cover tape 102 on the most upstream end 61A of the cover tape raising unit 61, and, in the present embodiment, is positioned on the cut portion 102a of the cover tape 102 cut by the cover tape cutting portion 622. Further, the upstream end portion 611A in the tape feeding direction H of the raising region expanding unit 611 is fixed to the lid member 7 described later.

The raising region expanding unit 611 has a first region expansion piece 6111 and a second region expansion piece 6112. The first region expansion piece 6111 and the second region expansion piece 6112 are plate-like members each having a predetermined length in the tape feeding direction H, and have upstream ends in the tape feeding direction H connected to each other. The connection portion of the first region expansion piece 6111 and the second region expansion piece 6112 is the upstream end portion 611A in the tape feeding direction H of the raising region expanding unit 611.

The first region expansion piece 6111 extends so as to be closer to an end on one direction side (+X direction side) in the width direction (X-axis direction) of the traveling path 5 from the upstream end in the tape feeding direction H, which is the connection portion with the second region expansion piece 6112, toward the downstream end. The upstream end in the tape feeding direction H of the first region expansion piece 6111 abuts on the cut portion 102a of the cut cover tape 102. The downstream end in the tape feeding direction H of the first region expansion piece 6111 has an end edge on the −Z direction side abutting on a boundary portion with the fusion portion 103 on one direction side (+X direction side) in the width direction of the cover tape 102.

The second region expansion piece 6112 extends so as to be closer to an end portion on the other direction side (−X direction side) in the width direction (X-axis direction) of the traveling path 5 from the upstream end in the tape feeding direction H, which is the connection portion with the first region expansion piece 6111, toward the downstream end. The upstream end in the tape feeding direction H of the second region expansion piece 6112 abuts on the cut portion 102a of the cut cover tape 102. The downstream end in the tape feeding direction H of the second region expansion piece 6112 has an end edge on the −Z direction side abutting on the boundary portion with the fusion portion 103 on the other direction side (−X direction side) in the width direction of the cover tape 102.

The raising region holding unit 612 is connected to the downstream end in the tape feeding direction H of the raising region expanding unit 611 via a connection member 613. The raising region holding unit 612 is connected to the raising region expanding unit 611 so as to be capable of swinging around the connection member 613. A tip of a downstream end portion in the tape feeding direction H of the raising region holding unit 612 is a most downstream end 61B of the cover tape raising unit 61, and is an ending point of abutting on the cover tape 102. The raising region holding unit 612 holds a raising region of the cover tape 102 expanded to a range up to the fusion portion 103 by the raising region expanding unit 611 in an as-is state. The cover tape raising unit 61 having a configuration in which the raising region holding unit 612 is connected to the raising region expanding unit 611 so as to be capable of swinging around the connection member 613 can swing in response to a change in a traveling behavior of the component storage tape 100 on the first path portion 51. Therefore, the stability of the raising processing of the cover tape 102 by the cover tape raising unit 61 is prevented from being lowered.

The raising region holding unit 612 has a first region holding piece 6121 and a second region holding piece 6122. Each of the first region holding piece 6121 and the second region holding piece 6122 is a plate-like member having a predetermined length in the tape feeding direction H.

The first region holding piece 6121 extends along the first path portion 51 in the traveling path 5 from the upstream end to the downstream end in the tape feeding direction H. The upstream end in the tape feeding direction H of the first region holding piece 6121 is connected to the downstream end of the first region expansion piece 6111 via the connection member 613. The first region holding piece 6121 is supported by the device main body 2 so as to be capable of swinging around the connection member 613 with respect to the first region expansion piece 6111. The downstream end in the tape feeding direction H of the first region holding piece 6121 is the most downstream end 61B of the cover tape raising unit 61. The end edge on the −Z direction side of the first region holding piece 6121 abuts on the boundary portion with the fusion portion 103 on one direction side (+X direction side) in the width direction of the cover tape 102.

The second region holding piece 6122 extends along the first path portion 51 in the traveling path 5 from the upstream end to the downstream end in the tape feeding direction H. The upstream end in the tape feeding direction H of the second region holding piece 6122 is connected to the downstream end of the second region expansion piece 6112 via the connection member 613. The second region holding piece 6122 is supported by the device main body 2 so as to be capable of swinging around the connection member 613 with respect to the second region expansion piece 6112. The downstream end in the tape feeding direction H of the second region holding piece 6122 is the most downstream end 61B of the cover tape raising unit 61. The end edge on the −Z direction side of the second region holding piece 6122 abuts on the boundary portion with the fusion portion 103 on the other direction side (−X direction side) in the width direction of the cover tape 102.

Further, as shown in FIG. 7, the first path portion 51 in which the cover tape raising unit 61 is disposed includes, as described above, the first region 511 on the most upstream side in the tape feeding direction H, the second region 512 continuous to the downstream side in the tape feeding direction H of the first region 511, and a third region 513 continuous to the downstream side in the tape feeding direction H of the second region 512.

When viewed from the width direction (X-axis direction) of the traveling path 5, in the first path portion 51, bending directions with respect to the Z-axis direction (vertical direction) are different between the first region 511 and the second region 512, and a sign of curvature changes. When the component storage tape 100 travels along the first path portion 51, forces for bending in opposite directions with respect to the Z-axis direction (vertical direction) act on the component storage tape 100 between at the time of passing through the first region 511 and at the time of passing through the second region 512. For this reason, for example, when the cover tape raising unit 61 is disposed over the first region 511 and the second region 512 in the first path portion 51, the stability of the raising processing for the cover tape 102 by the cover tape raising unit 61 may be lowered.

Therefore, as shown in FIG. 7, in the cover tape raising unit 61, the most upstream end 61A in the tape feeding direction H, which is the starting point of abutting on the cover tape 102, is disposed so as to be located on or in the vicinity of a boundary line 51 between the first region 511 and the second region 512 in the first path portion 51. In such a configuration, since the most upstream end 61A of the cover tape raising unit 61 is located on or in the vicinity of the boundary line 51 between the first region 511 and the second region 512, the cover tape raising unit 61 is not disposed over the first region 511 and the second region 512, and is disposed in the second region 512. Therefore, the stability of the raising processing of the cover tape 102 by the cover tape raising unit 61 is prevented from being lowered.

Further, when the component storage tape 100 travels in the first region 511 and the second region 512 of the first path portion 51, the component storage tape 100 travels while bending. Here, in the component storage tape 100 traveling in the first path portion 51, a bending direction at the time of traveling changes at an inflection point between the first region 511 and the second region 512 as the boundary, between a case where the component storage tape 100 is fed out by the first tape feed-out unit 31 disposed on the upstream side of the first path portion 51 and a case where the component storage tape 100 is fed out by the second tape feed-out unit 32 disposed on the downstream side of the first path portion 51, and a traveling behavior on the first path portion 51 changes. Specifically, the component storage tape 100 fed out by the first tape feed-out unit 31 is bent to the +Z direction side (upward side) in the first region 511, and to the −Z direction side (downward side) in the second region 512. Further, the component storage tape 100 fed out by the second tape feed-out unit 32 is bent to the −Z direction side (downward side) in the first region 511, and to the +Z direction side (upward side) in the second region 512.

In the cover tape raising unit 61 of the present embodiment, as described above, only the upstream end portion 611A of the raising region expanding unit 611 is fixed to the lid member 7 described later, and the raising region holding unit 612 is connected to the raising region expanding unit 611 so as to be capable of swinging around the connection member 613. In this manner, the cover tape raising unit 61 can swing in response to a change in the traveling behavior of the component storage tape 100 on the first path portion 51. Therefore, the stability of the raising processing of the cover tape 102 by the cover tape raising unit 61 is prevented from being lowered.

Further, as shown in FIG. 7, the third region 513 continuous to the downstream side in the tape feeding direction H of the second region 512 where the cover tape raising unit 61 is disposed in the first path portion 51 is formed in a convex shape in the +Z direction (upward direction) when viewed from the width direction (X-axis direction) of the traveling path 5.

As described above, the second tape feed-out unit 32 including the pair of second sprockets 321 is disposed at the most downstream end in the tape feeding direction H of the third region 513, which corresponds to the most downstream end in the tape feeding direction H of the first path portion 51 in the traveling path 5. The third region 513 has a convex shape in the +Z direction (upward direction) in order to improve fitting property when the hole 101b of the carrier tape 101 at the tip portion of the component storage tape 100, which is fed out by the first tape feed-out unit 31 and travels in the third region 513, is fitted to the tooth portion 321a of the pair of second sprockets 321. Furthermore, the component storage tape 100 received by the second tape feed-out unit 32 can be reliably fed out by the second tape feed-out unit 32 toward the third tape feed-out unit 33 provided close to the component extraction position 21 in the third path portion 53 on the downstream side in the tape feeding direction H of the first path portion 51.

A height position of the most downstream end in the tape feeding direction H of the third region 513 is set in consideration of the fitting property of the hole 101b of the carrier tape 101 with the tooth portion 321a of the pair of second sprockets 321, and a prevention effect of buckling deformation of the carrier tape 101 at the time of the raising processing of the cover tape 102. The height position of the most downstream end of the third region 513 is set so as not to be the same as a height position of the most upstream end of the first region 511 corresponding to the most upstream end in the tape feeding direction H of the first path portion 51.

Next, the cover tape pre-processing unit 62 and the cover tape post-processing unit 63 of the component exposure unit 6 will be described with reference to FIGS. 2 and 6.

The cover tape pre-processing unit 62 is disposed in the second path portion 52 continuous to the upstream side in the tape feeding direction H of the first path portion 51 in the traveling path 5 in a manner spaced apart from the cover tape raising unit 61. The cover tape pre-processing unit 62 performs pre-processing of cutting the cover tape 102 with respect to the component storage tape 100 which is fed out by the first tape feed-out unit 31 and travels in the second path portion 52 in a state where the tip is a free end, prior to the raising processing of the cover tape 102 by the cover tape raising unit 61. As a result, the cover tape raising unit 61 abuts on the cover tape 102 of the component storage tape 100 smoothly, and the raising processing of the cover tape 102 by the cover tape raising unit 61 is smoothly performed.

The component storage tape 100 after the raising processing of the cover tape 102 by the cover tape raising unit 61 is fed out by the second tape feed-out unit 32 to the third path portion 53 on the downstream side of the first path portion 51 in the traveling path 5. The cover tape post-processing unit 63 is disposed in the third path portion 53. The cover tape post-processing unit 63 performs post-processing of spreading the cover tape 102 after the raising processing by the cover tape raising unit 61 in the width direction of the component storage tape 100. In this manner, the exposure of the component E in the component storage unit 101a of the component storage tape 100 is increased. Therefore, the extraction property of the component E at the component extraction position 21 can be improved.

Figure 8:
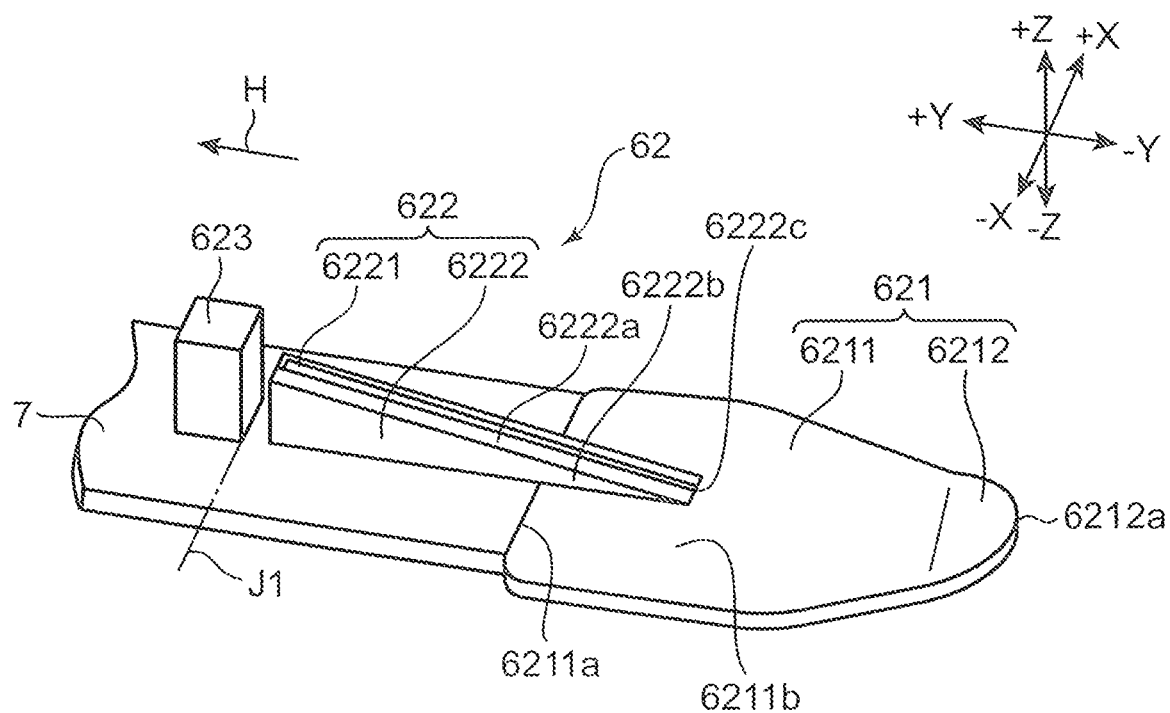
FIG. 8 is a diagram illustrating a configuration of a cover tape pre-processing unit 62 in the component exposure unit 6.

The detailed configuration of the cover tape pre-processing unit 62 in the component exposure unit 6 will be described with reference to FIG. 8. FIG. 8 is a diagram illustrating a configuration of the cover tape pre-processing unit 62 in the component exposure unit 6. The cover tape pre-processing unit 62 includes an insertion member 621, the cover tape cutting portion 622, and a support unit 623.

The insertion member 621 is a member that is inserted between the cover tape 102 and the carrier tape 101 in the component storage tape 100 traveling in the second path portion 52, the component storage tape 100 being fed out by the first tape feed-out unit 31 in a state where a tip of the component storage tape 100 is a free end. The insertion member 621 is formed in a flat plate shape. The insertion member 621 has a base 6211 and a tip portion 6212 continuous to the upstream end in the tape feeding direction H of the base 6211. Note that the lid member 7 described later is connected to a downstream end 6211a in the tape feeding direction H of the base 6211 of the insertion member 621.

In the insertion member 621, the tip portion 6212 is raised from the base 6211 so as to be inclined to the +Z direction side (upward side) from a connection portion with the base 6211 toward the upstream end 6212a in the tape feeding direction H. In other words, in the state where the insertion member 621 is inserted between the cover tape 102 and the carrier tape 101, the base 6211 is substantially parallel to the cover tape 102, and the tip portion 6212 is inclined toward the cover tape 102 side in a manner spaced apart from the carrier tape 101.

With the tip portion 6212 of the insertion member 621 having the inclined structure as described above, when the component storage tape 100 is fed out by the first tape feed-out unit 31 in a state where the insertion member 621 is inserted between the cover tape 102 and the carrier tape 101, the tip portion 6212 can be prevented from coming into contact with a storage unit connection region portion located between adjacent ones of the component storage units 101a in the carrier tape 101. For this reason, excellent traveling property of the component storage tape 100 is maintained, and the component E can be efficiently supplied toward the component extraction position 21.

The insertion member 621 is supported by the support unit 623. In the present embodiment, the support unit 623 is disposed on an upper surface of the lid member 7 described later connected to the downstream end 6211a in the tape feeding direction H of the base 6211 of the insertion member 621, and is fixed to the device main body 2. With such a configuration, the support unit 623 supports the insertion member 621 with the lid member 7 interposed therebetween.

The cover tape cutting portion 622 cuts the cover tape 102 of the component storage tape 100 that is fed out by the first tape feed-out unit 31 in a state in which the tip of that is a free end, and travels in the second path portion 52. The cover tape cutting portion 622 cuts a predetermined position (for example, a central position) between both ends in the width direction of the cover tape 102. The cut portion 102a of the cover tape 102 cut by the cover tape cutting portion 622 linearly extends along the traveling path 5.

The cover tape cutting portion 622 includes a blade portion 6221 for cutting the cover tape 102 and a holding portion 6222. The holding portion 6222 has a holding surface 6222a that holds the blade portion 6221 so that an edge of a blade is exposed.

The cover tape cutting portion 622 is supported by the support unit 623 with the lid member 7 interposed therebetween such that at least a surface on the opposite side of a holding surface 6222a in a region portion 6222b on the upstream side in the tape feeding direction H of the holding portion 6222 abuts on a surface 6211b on the +Z direction side (upper side) of the base 6211 of the insertion member 621. Further, in the cover tape cutting portion 622, the blade portion 6221 held by the holding surface 6222a of the holding portion 6222 faces the +Z direction side (upper side). In such a configuration, when the component storage tape 100 traveling in the second path portion 52 in the traveling path 5 passes through the cover tape cutting portion 622, the insertion member 621 is interposed between an upstream end 6222c of the cover tape cutting portion 622 and the carrier tape 101. For this reason, it is possible to prevent the upstream end 6222c of the cover tape cutting portion 622 from coming into contact with the component E stored in the component storage unit 101a of the carrier tape 101. Therefore, damage to the component E due to contact with the cover tape cutting portion 622 can be prevented.

Further, in the holding portion 6222 of the cover tape cutting portion 622, the holding surface 6222a is preferably an inclined surface which is inclined downward from the downstream side to the upstream side in the tape feeding direction H. In this manner, when traveling in the second path portion 52 in the traveling path 5 and passing through the cover tape cutting portion 622, the component storage tape 100 is guided along the holding surface 6222a of the holding portion 6222 having the inclined surface. As a result, traveling resistance when the component storage tape 100 passes through the cover tape cutting portion 622 can be reduced.

Further, the insertion member 621 may be configured to be supported by the support unit 623 with the lid member 7 interposed therebetween, so as to be capable of swinging around a predetermined axis J1 extending in the width direction (X-axis direction) of the second path portion 52 in the traveling path 5. Further, in the cover tape cutting portion 622, at least the region portion 6222b on the upstream side in the tape feeding direction H of the holding portion 6222 abuts on the surface 6211b on the +Z direction side (upper side) of the base 6211 of the insertion member 621, so that the cover tape cutting portion 622 can swing in conjunction with the swinging of the insertion member 621. In this manner, for example, in a case where the component storage tape 100 travels in the traveling path 5 while bending, the insertion member 621 and the cover tape cutting portion 622 inserted between the cover tape 102 and the carrier tape 101 become swingable in accordance with the bending of the component storage tape 100. Therefore, the contact of the tip portion 6212 of the insertion member 621 with the storage unit connection region portion of the carrier tape 101 can be stably suppressed.

Next, the lid member 7 provided in the component supply device 1 will be described with reference to FIGS. 2 and 6. The lid member 7 is a member that covers at least part of each opening of the component storage unit 101a of the component storage tape 100 after the exposure processing for exposing the component E in the component storage unit 101a by the component exposure unit 6. The component supply device 1 includes the lid member 7, so that pop-out of the component E from the component storage unit 101a when the component storage tape 100 after the exposure processing is fed out by the tape feed-out unit 3 can be regulated by the lid member 7. Therefore, a component can be stably supplied to the component extraction position 21 by the component supply device 1.

In the present embodiment, the lid member 7 extends along the traveling path 5 from the downstream end 6211a in the tape feeding direction H in the base 6211 of the insertion member 621 to the component extraction position 21. Further, the lid member 7 connected to the downstream end 6211a of the base 6211 of the insertion member 621 covers the component storage unit 101a along the traveling path 5 in a state of being inserted between the cover tape 102 and the carrier tape 101 of the component storage tape 100 fed out by the tape feed-out unit 3. For this reason, the lid member 7 has a function of guiding the traveling of the component storage tape 100 fed out by the tape feed-out unit 3 in a state of being inserted between the cover tape 102 and the carrier tape 101.

As described above, when the component storage tape 100 travels in the first region 511 and the second region 512 of the first path portion 51, the component storage tape 100 travels while bending. For this reason, in the component storage tape 100 traveling in the first region 511 and the second region 512 of the first path portion 51, there is possibility that the frictional force due to the contact between the lid member 7 covering the component storage unit 101a and the carrier tape 101 is increased.

In view of the above, the lid member 7 is desirably a flexible member. In such a configuration, when the component storage tape 100 travels while bending along the first region 511 and the second region 512 of the first path portion 51, the lid member 7 bends in accordance with the bending of the component storage tape 100. In this manner, in the component storage tape 100 traveling in the first region 511 and the second region 512 of the first path portion 51, increase in the frictional force due to the contact between the lid member 7 covering the component storage unit 101a and the carrier tape 101 can be suppressed. Therefore, the traveling resistance when the component storage tape 100 travels in the traveling path 5 can be reduced.

<Configuration of Tape Introduction Guiding Unit>

Figure 9A:
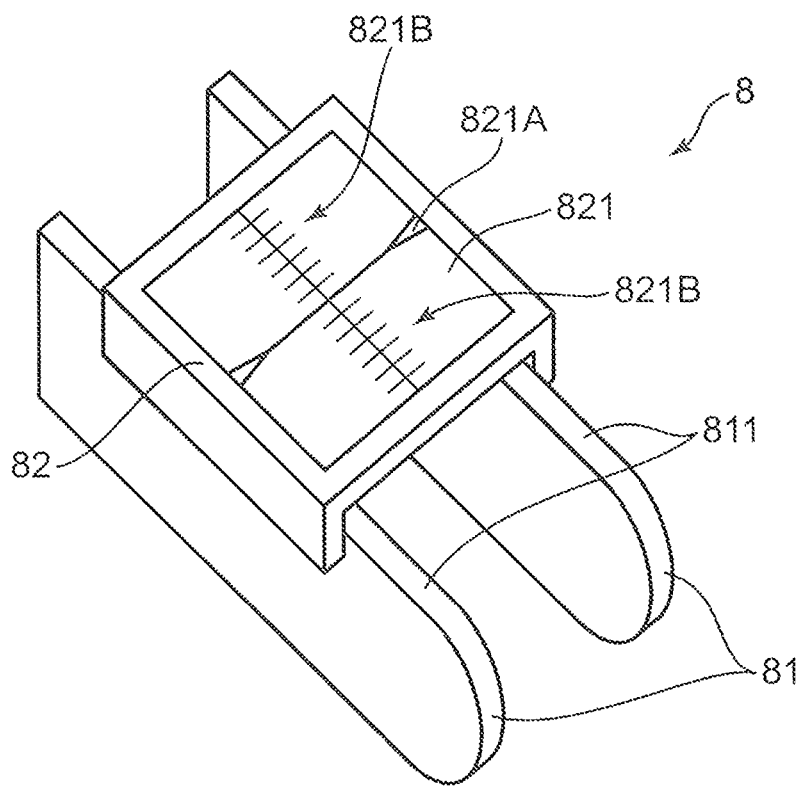
FIG. 9A is a perspective view of a tape introduction guiding unit included in the component supply device.
Figure 9B:
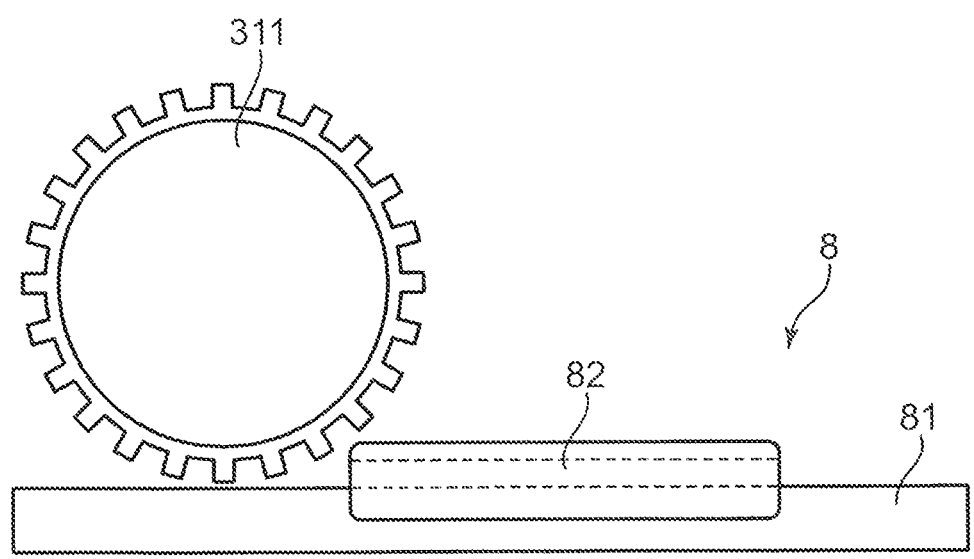
FIG. 9B is a side view of the tape introduction guiding unit.
Figure 9C:
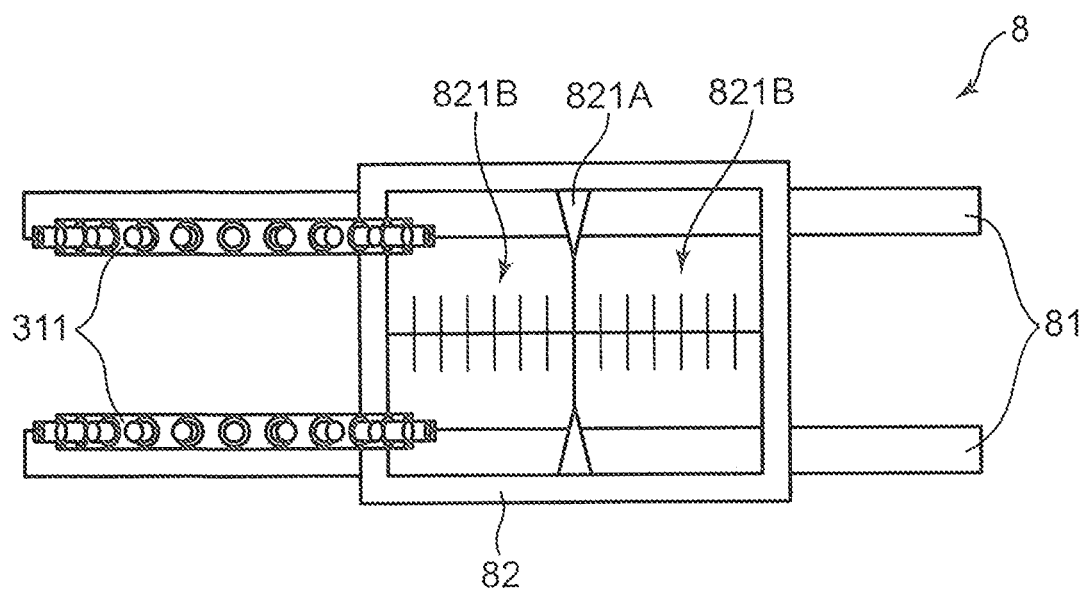
FIG. 9C is a plan view of the tape introduction guiding unit.

Next, with reference to FIGS. 9A, 9B, and 9C in addition to FIG. 2, the tape introduction guiding unit 8 will be described. FIGS. 9A to 9C are diagrams showing the configuration of the tape introduction guiding unit 8 provided in the component supply device 1. FIG. 9A is a perspective view of the tape introduction guiding unit 8, FIG. 9B is a side view of the tape introduction guiding unit 8, and FIG. 9C is a plan view of the tape introduction guiding unit 8.

In the component supply device 1 according to the present embodiment, introduction of the component storage tape 100 into the component supply device 1 is performed by an operator. The operator introduces the component storage tape 100 into the first tape feed-out unit 31 of the tape feed-out unit 3 through the tape introduction guiding unit 8. The tape introduction guiding unit 8 is disposed in the device main body 2 on the upstream side in the tape feeding direction H of the first tape feed-out unit 31. The tape introduction guiding unit 8 guides the introduction of the component storage tape 100 to the first sprocket 311 of the first tape feed-out unit 31. When the component storage tape 100 is introduced through the tape introduction guiding unit 8, the first tape feed-out unit 31 (first sprocket 311) performs a first loading operation (first feed-out operation) for feeding out the introduced component storage tape 100.

The tape introduction guiding unit 8 includes a main body 81 and a guide display unit 82. As shown in FIGS. 2 and 9A, the main body 81 of the tape introduction guiding unit 8 is a pair of protruding pieces that are provided to protrude in the −Y direction from the end surface on the −Y direction side of the pair of guide walls 41 in the tape traveling path forming unit 4. An upper surface 811 of the main body 81 is flush with the guide surfaces 411 of the pair of guide walls 41.

The guide display unit 82 of the tape introduction guiding unit 8 has a display surface 821 arranged to face the upper surface 811 at an interval on the +Z direction side (upper side) from the upper surface 811 of the main body 81. The display surface 821 of the guide display unit 82 is formed in a rectangular shape and is made from a transparent member having translucency. When the component storage tape 100 is introduced to the first sprocket 311 of the first tape feed-out unit 31 through the tape introduction guiding unit 8, the component storage tape 100 is inserted between the upper surface 811 of the main body 81 and the display surface 821 of the guide display unit 82. At this time, since the display surface 821 of the guide display unit 82 is configured by a transparent member, the operator can visually recognize the component storage tape 100 from the upper side of the display surface 821.

A mark 821A and a scale 821B are provided on the display surface 821 of the guide display unit 82. That is, the tape introduction guiding unit 8 has the mark 821A and the scale 821B provided on the display surface 821 of the guide display unit 82. When the component storage tape 100 is introduced to the first sprocket 311 of the first tape feed-out unit 31, the mark 821A is aligned with a center of the standard component storage unit 101aA in the component storage tape 100. The work of aligning the center of the standard component storage unit 101aA in the component storage tape 100 with the mark 821A is performed by the operator. The scale 821B is checked by the operator during the alignment work. The workability of the alignment work is improved by the operator performing the alignment work while checking the scale 821B.

Figure 10:
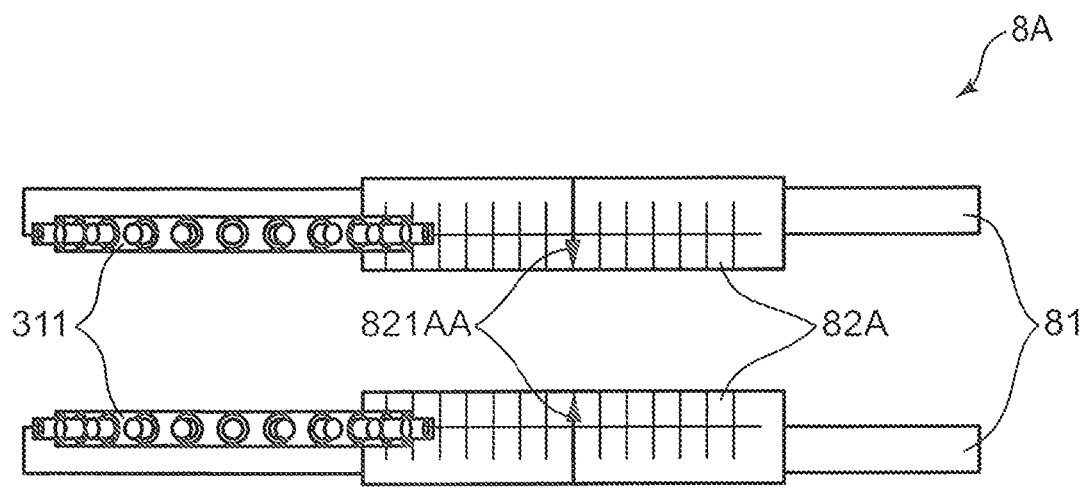
FIG. 10 is a plan view illustrating a modification of the tape introduction guiding unit.

The shape of the tape introduction guiding unit 8 is not particularly limited as long as the tape introduction guiding unit 8 is configured to guide the introduction of the component storage tape 100 to the first sprocket 311 of the first tape feed-out unit 31. The tape introduction guiding unit 8 may be configured as shown in FIG. 10, for example. FIG. 10 is a plan view illustrating a tape introduction guiding unit 8A which is a modification of the tape introduction guiding unit. The tape introduction guiding unit 8A illustrated in FIG. 10 is configured similarly to the tape introduction guiding unit 8 except that a configuration of a guide display unit 82A is different as compared with the tape introduction guiding unit 8 described above. The tape introduction guiding unit 8A includes the main body 81 and the guide display unit 82A.

The guide display units 82A of the tape introduction guiding unit 8A are disposed on the upper side of the main bodies 81 corresponding to the pair of guide walls 41 so as to be separated in the width direction (X-axis direction). Similar to the above-described guide display unit 82, the guide display unit 82A is also provided with a mark 821AA. When the component storage tape 100 is introduced to the first sprocket 311 of the first tape feed-out unit 31, the mark 821AA of the guide display unit 82A is aligned with the center of the standard component storage unit 101aA in the component storage tape 100.

Hereinafter, description will be made of a configuration of the component supply device 1 including the tape introduction guiding unit 8 illustrated in FIGS. 9A to 9C as a tape introduction guiding unit.

<Configuration of Tape Detection Unit>

As shown in FIG. 2, the component supply device 1 further includes an introductory tape detection unit 23, a first tape detection unit 24, and a second tape detection unit 25. The introductory tape detection unit 23 is attached to a boundary portion between the main body 81 of the tape introduction guiding unit 8 and the tape traveling path forming unit 4. The introductory tape detection unit 23 detects the component storage tape 100 introduced to the first sprocket 311 of the first tape feed-out unit 31 through the tape introduction guiding unit 8.

The first tape detection unit 24 is disposed between the first tape feed-out unit 31 and the second tape feed-out unit 32 in the tape feeding direction H. In the present embodiment, the first tape detection unit 24 is disposed between the first tape feed-out unit 31 and the cover tape pre-processing unit 62 of the component exposure unit 6 in the tape feeding direction H. The first tape detection unit 24 detects the component storage tape 100 fed out by the first sprocket 311 of the first tape feed-out unit 31.

The second tape detection unit 25 is disposed between the second tape feed-out unit 32 and the component extraction position 21 in the tape feeding direction H. In the present embodiment, the second tape detection unit 25 is disposed between the second tape feed-out unit 32 and the third tape feed-out unit 33 in the tape feeding direction H. The second tape detection unit 25 detects the component storage tape 100 fed out by the second sprocket 321 of the second tape feed-out unit 32.

Figure 11A:
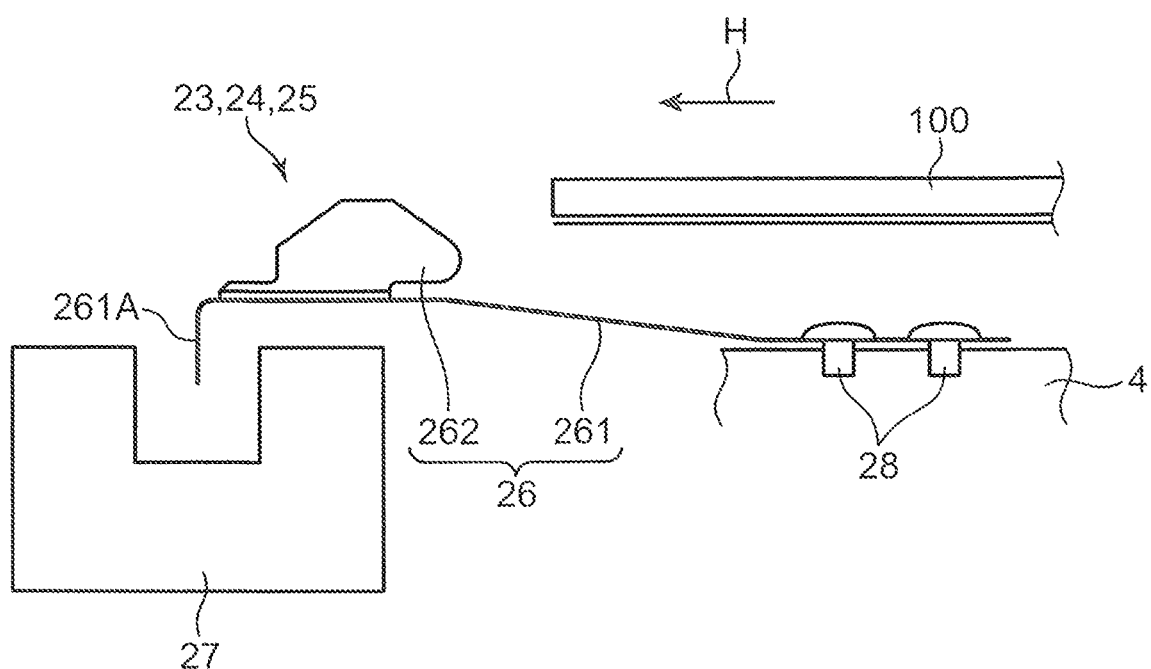
FIG. 11A is a side view illustrating a configuration of an introductory tape detection unit, a first tape detection unit, and a second tape detection unit included in the component supply device.
Figure 11B:
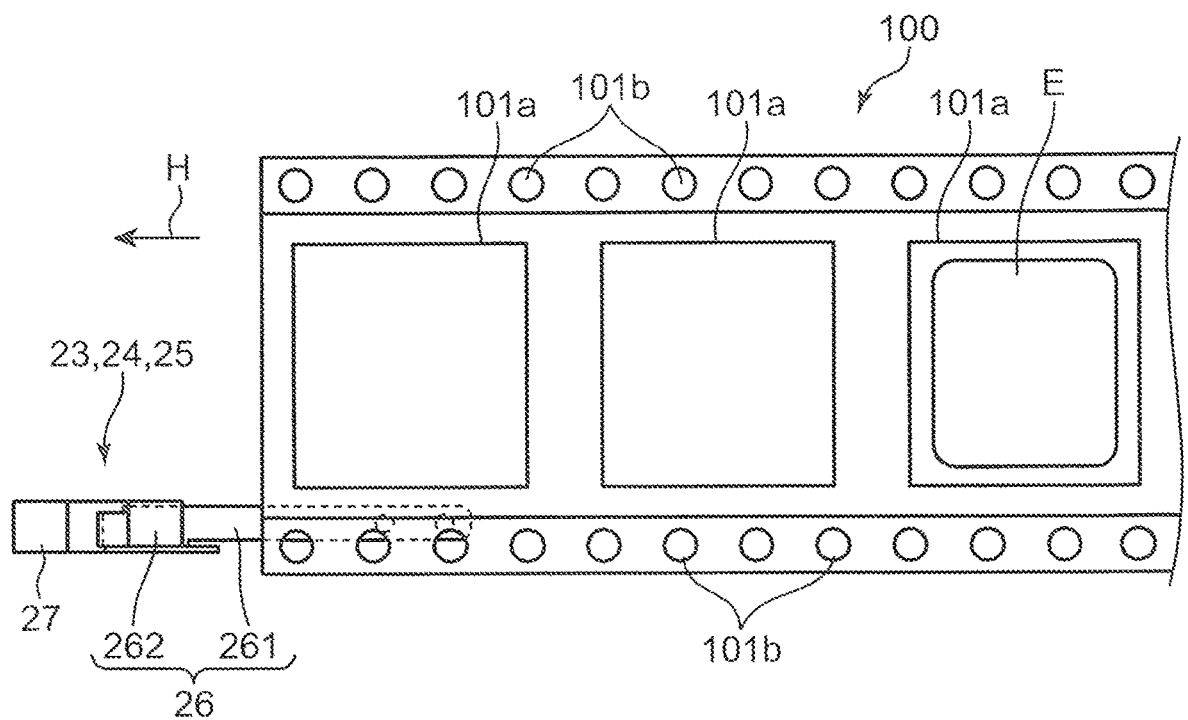
FIG. 11B is a plan view of the introductory tape detection unit, the first tape detection unit, and the second tape detection unit.

Configurations of the introductory tape detection unit 23, the first tape detection unit 24, and the second tape detection unit 25 will be described in detail with reference to FIGS. 11A and 11B. FIG. 11A is a side view illustrating the configuration of the tape introduction detection unit 23, the first tape detection unit 24, and the second tape detection unit 25 included in the component supply device 1. FIG. 11B is a plan view of the tape introduction detection unit 23, the first tape detection unit 24, and the second tape detection unit 25.

The introductory tape detection unit 23, the first tape detection unit 24, and the second tape detection unit 25 are configured identically. Each of the tape detection units 23, 24, and 25 includes a dog 26 and a sensor unit 27. Each of the tape detection units 23, 24, and 25 is a mechanical tape detection sensor that detects the component storage tape 100 by the sensor unit 27 detecting the dog 26 displaced by abutting of the tip of the component storage tape 100. The dog 26 includes an elongated plate-like body 261 and a contact piece 262 attached to an upper surface of one end (end on the downstream side in the tape feeding direction H) of the plate-like body 261. In the plate-like body 261 of the dog 26, the other end (end on the upstream side in the tape feeding direction H) opposite to the one end to which the contact piece 262 is attached is fixed to the tape traveling path forming unit 4 by a screw member 28. Further, a region portion 261A (hereinafter, referred to as "tip portion 261A") closer to the tip side than the contact piece 262 in one end of the plate-like body 261 is bent downward. In the present embodiment, the other end of the plate-like body 261 is fixed on the guide surface 411 of one of the pair of guide walls 41 constituting the tape traveling path forming unit 4. The plate-like body 261 is disposed to extend along the guide surface 411 in a state where the other end is fixed on the guide surface 411.

The contact piece 262 in the dog 26 is a portion on which the component storage tape 100 abuts. When the component storage tape 100 abuts on the contact piece 262, the plate-like body 261 pivots around a portion fixed to the screw member 28 so that the tip portion 261A is displaced downward. When the tip portion 261A of the plate-like body 261 is displaced downward, the sensor unit 27 detects the tip portion 261A. Each of the introductory tape detection unit 23, the first tape detection unit 24, and the second tape detection unit 25 detects the component storage tape 100 when the sensor unit 27 detects the tip portion 261A of the plate-like body 261.

As the component storage tape 100, a wide variety of tapes exist, such as one made of a transparent material having translucency and one made of an opaque material not having translucency. In a case where, for example, an optical tape detection sensor is used as a sensor for detecting the component storage tape 100, a wide variety of the component storage tapes 100 cannot be suitably detected. In view of the above, by configuring each of the introductory tape detection unit 23, the first tape detection unit 24, and the second tape detection unit 25 as a mechanical tape detection sensor including the dog 26 and the sensor unit 27, a wide variety of the component storage tapes 100 can be suitably detected.

Further, in the wide component storage tape 100 having the length K2 of 32 mm or more in the width direction, the thickness of the tape becomes large because the component storage unit 101a becomes deep. For this reason, the component storage tape 100 is a tape that is difficult to cut with scissors, for example. As a result, a shape of the tip, which is an end surface after cutting, of the component storage tape 100 does not necessarily have a linear shape parallel to the tape width direction. Here, each of the tape detection units 23, 24, and 25 is a mechanical tape detection sensor including the dog 26 and the sensor unit 27 as described above. Furthermore, the plate-like body 261 constituting the dog 26 is fixed on the guide surface 411 of one of the pair of guide walls 41. For this reason, each of the tape detection units 23, 24, and 25 can detect the same portion of the tip of the component storage tape 100 regardless of the shape of the tip of the component storage tape 100.

<Electrical Configuration of Component Supply Device>

Figure 12:
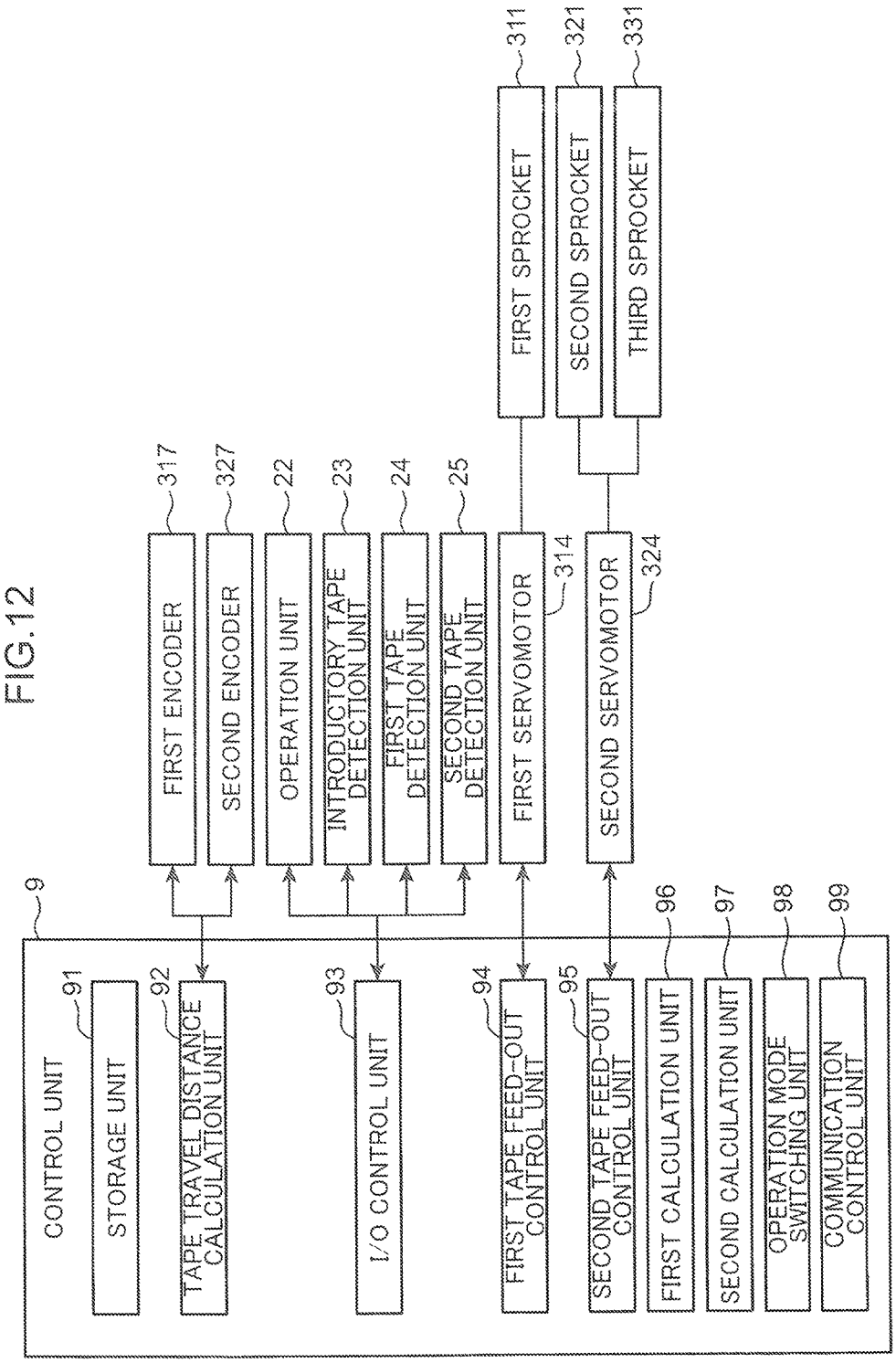
FIG. 12 is a block diagram showing an electrical configuration of the component supply device.

Next, an electrical configuration of the component supply device 1 will be described with reference to FIG. 12. FIG. 12 is a block diagram illustrating the electrical configuration of the component supply device 1. The component supply device 1 further includes a control unit 9.

The control unit 9 controls the overall operation of the component supply device 1. The control unit 9 is formed of, for example, a microcomputer incorporating a storage device, such as a read only memory (ROM) for storing a control program or a flash memory for temporarily storing data, and controls operation of the component supply device 1 by reading out the control program. The control unit 9 includes a storage unit 91, a tape travel distance calculation unit 92, an I/O control unit 93, a first tape feed-out control unit 94, a second tape feed-out control unit 95, a first calculation unit 96, a second calculation unit 97, an operation mode switching unit 98, and a communication control unit 99.

The storage unit 91 stores, in advance, a first separation distance D1 (see FIG. 2) in the tape feeding direction H between the mark 821A of the tape introduction guiding unit 8 and the first tape detection unit 24, a second separation distance D2 (see FIG. 2) in the tape feeding direction H between the second tape detection unit 25 and the component extraction position 21, a length P1 (see FIGS. 14A and 14B described later) between centers of adjacent ones of the component storage units 101a in the component storage tape 100, and a length P2 (see FIG. 15 described later) between adjacent ones of the holes 101b in the component storage tape 100.

The tape travel distance calculation unit 92 receives an output signal (first encoder signal) from a first encoder 317 and an output signal (second encoder signal) from a second encoder 327. The first encoder 317 detects a rotation angle of a rotor of the first servomotor 314 that rotationally drives the first sprocket 311 of the first tape feed-out unit 31 and outputs the detection result as the first encoder signal to the tape travel distance calculation unit 92. The second encoder 327 detects a rotation angle of a rotor of the second servomotor 324 that rotationally drives the second sprocket 321 of the second tape feed-out unit 32 and the third sprocket 331 of the third tape feed-out unit 33, and outputs the detection result as the second encoder signal to the tape travel distance calculation unit 92.

The tape travel distance calculation unit 92 calculates a travel distance of the component storage tape 100 fed out by the first sprocket 311 of the first tape feed-out unit 31 based on the first encoder signal output from the first encoder 317. Further, the tape travel distance calculation unit 92 calculates a travel distance of the component storage tape 100 fed out by the second sprocket 321 of the second tape feed-out unit 32 and the third sprocket 331 of the third tape feed-out unit 33 based on the second encoder signal output from the second encoder 327.

The I/O control unit 93 is configured to be capable of receiving a signal from the operation unit 22, the introductory tape detection unit 23, the first tape detection unit 24, and the second tape detection unit 25. The I/O control unit 93 receives an instruction signal indicating an instruction by the operator for operating the component supply device 1 from the operation unit 22. Further, the I/O control unit 93 receives, from the tape detection units 23, 24, and 25, a tape detection signal indicating the detection result of the component storage tape 100 detected by each of the introductory tape detection unit 23, the first tape detection unit 24, and the second tape detection unit 25.

The operation mode switching unit 98 switches an operation mode for feeding out the component storage tape 100 according to a type of the component storage tape 100 introduced to the first sprocket 311 of the first tape feed-out unit 31 through the tape introduction guiding unit 8. Before describing the detailed configuration of the operation mode switching unit 98, a type of the component storage tape 100 will be described with reference to FIGS. 13A and 13B. The component storage tape 100 used in the component supply device 1 of the present embodiment includes a first component storage tape 100A illustrated in FIG. 13A and a second component storage tape 100B illustrated in FIG. 13B.

Figure 13A:
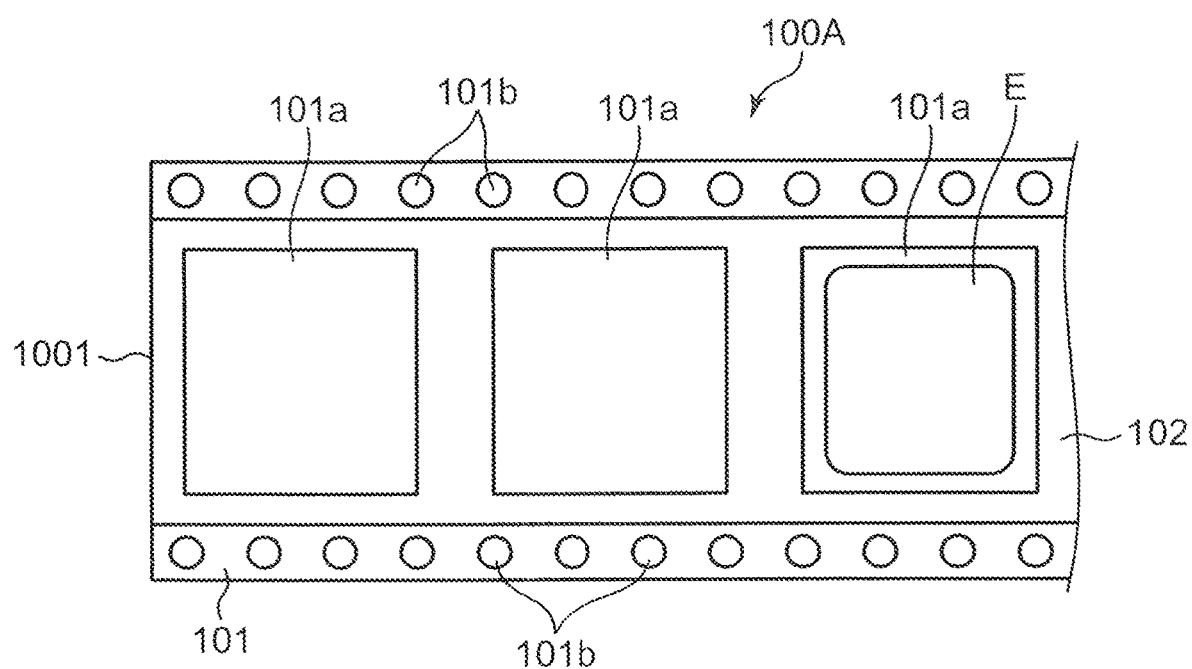
FIG. 13A is a diagram illustrating a first component storage tape.
Figure 13B:
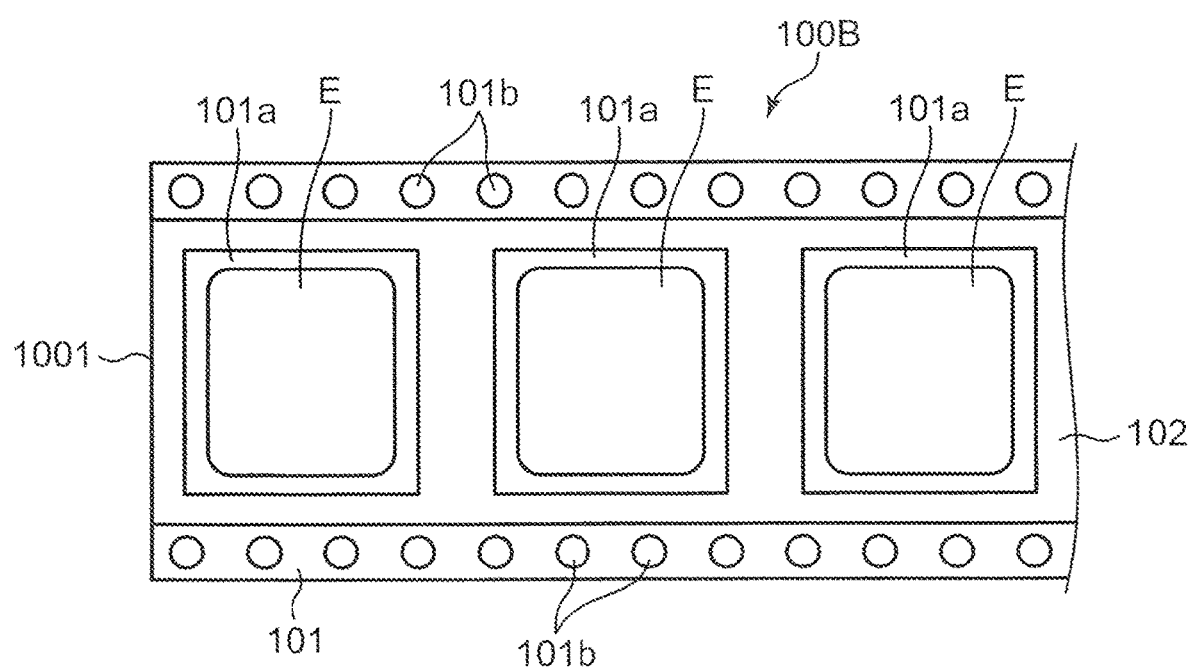
FIG. 13B is a diagram illustrating a second component storage tape.

The first component storage tape 100A illustrated in FIG. 13A is a tape in which empty component storage units 101a, in each of which the component E is not stored, are disposed within a range of a predetermined length from the tip. In the example illustrated in FIG. 13A, the component E is not stored in two of the component storage units 101a from the tip. Examples of the first component storage tape 100A include a new component storage tape used for the first time in the component supply device 1. On the other hand, the second component storage tape 100B illustrated in FIG. 13B is a tape in which the component E is stored in all of the component storage units 101a. Examples of the second component storage tape 100B include a component storage tape that has a history of being used in the component supply device 1 and is in a state where a portion of the component storage unit 101a, from which the component E is taken out by the head unit 14, is cut.

The operator can input, through the operation unit 22, an instruction of selecting one of the first component storage tape 100A and the second component storage tape 100B for the type of the component storage tape 100 to be introduced to the first sprocket 311 of the first tape feed-out unit 31 through the tape introduction guiding unit 8. When an instruction to select the component storage tape 100 is input to the operation unit 22 by the operator, the I/O control unit 93 receives, from the operation unit 22, an instruction signal (tape selection instruction signal) indicating an instruction to select the component storage tape 100. The tape selection instruction signal received by the I/O control unit 93 is transmitted to the operation mode switching unit 98.

The operation mode switching unit 98 switches an operation mode between a first feed-out operation mode for feeding out the first component storage tape 100A and a second feed-out operation mode for feeding out the second component storage tape 100B based on the tape selection instruction signal.

Figure 15A:
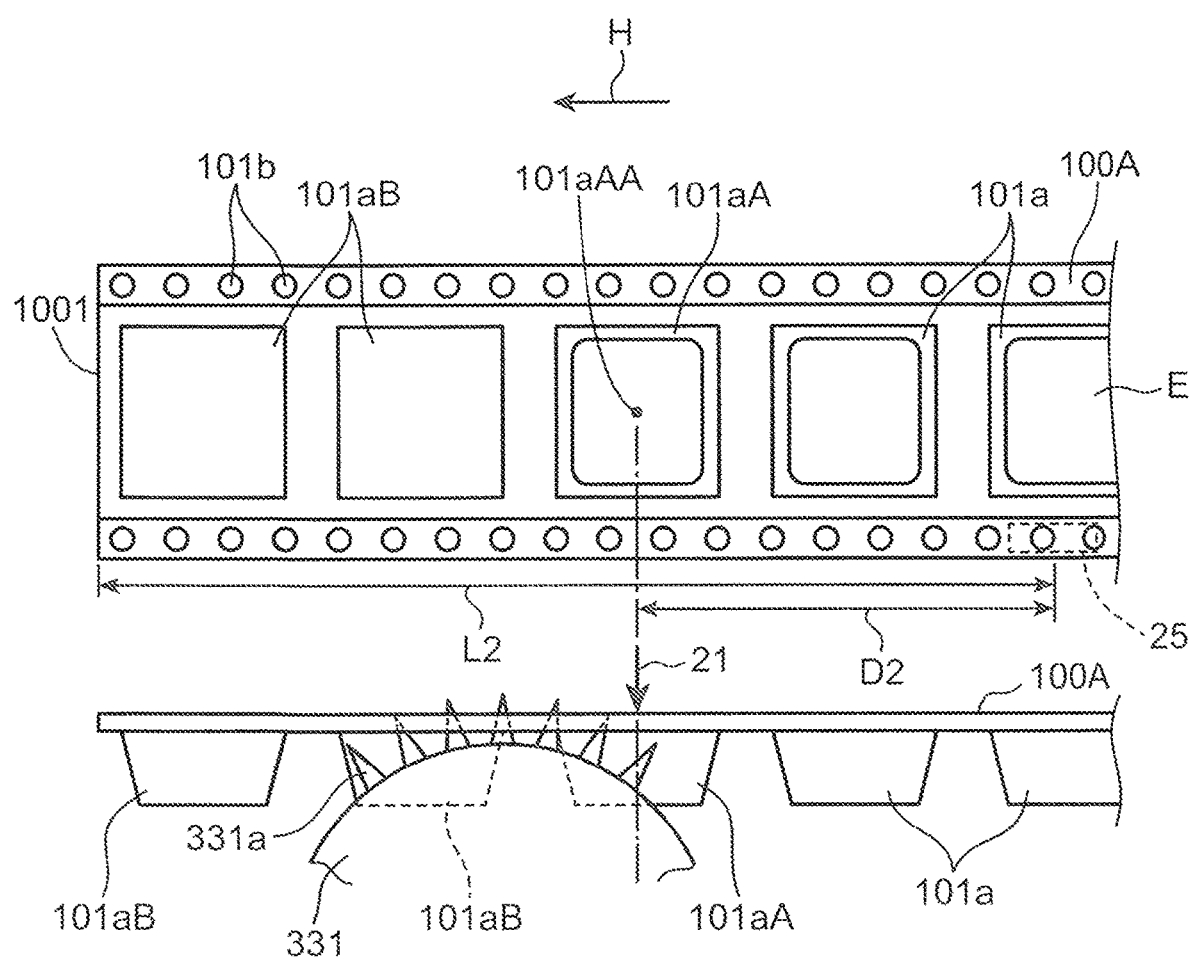
FIG. 15A is a diagram for describing loading operation in a case of using the first component storage tape.

Next, the first tape feed-out control unit 94, the second tape feed-out control unit 95, the first calculation unit 96, and the second calculation unit 97 will be described with reference to FIGS. 14A, 14B, 15A, 15B, and 16 in addition to FIG. 12. FIG. 14A is a diagram for describing a loading operation in a case where the first component storage tape 100A is introduced to the first sprocket 311 of the first tape feed-out unit 31 through the tape introduction guiding unit 8. FIG. 14B is a diagram for describing a loading operation in a case where the second component storage tape 100B is introduced to the first sprocket 311 of the first tape feed-out unit 31 through the tape introduction guiding unit 8. FIG. 15A is a diagram for describing the loading operation in a case of using the first component storage tape 100A. FIG. 15B is a diagram for describing the loading operation in a case of using the second component storage tape 100B. FIG. 16 is a diagram for describing the operation of the third sprocket 331 of the third tape feed-out unit 33 at the time of the loading operation.

As shown in FIGS. 14A and 14B, when the operator aligns a center 101aAA of a standard component storage unit 101aA in the first component storage tape 100A or the second component storage tape 100B with the mark 821A of the tape introduction guiding unit 8, the introductory tape detection unit 23 detects the component storage tapes 100A and 100B. Note that, in the example illustrated in FIGS. 14A and 14B, the standard component storage unit 101aA in the component storage tapes 100A and 100B is a third component storage unit from a tip 1001.

When the introductory tape detection unit 23 detects the component storage tapes 100A and 100B, the component storage tapes 100A and 100B are in a state of being introduced to the first sprocket 311 of the first tape feed-out unit 31 through the tape introduction guiding unit 8.

When the component storage tapes 100A and 100B are introduced to the first sprocket 311 of the first tape feed-out unit 31 through the tape introduction guiding unit 8, the first tape feed-out control unit 94 controls the first servomotor 314 of the first tape feed-out unit 31 so that the component storage tapes 100A and 100B are fed out by the first sprocket 311.

The first calculation unit 96 calculates a standard tape length L1 indicating a length from the tip 1001 of the component storage tapes 100A and 100B fed out by the first sprocket 311 of the first tape feed-out unit 31 to the center 101aAA of the standard component storage unit 101aA. Specifically, the first calculation unit 96 calculates the standard tape length L1 based on an equation (1) below:

$$\text{Standard tape length } L1 = D1 - DS \tag{1}$$

In the equation (1), "D1" indicates a first separation distance in the tape feeding direction H between the mark 821A of the tape introduction guiding unit 8 and the first tape detection unit 24. The first separation distance D1 is stored in advance in the storage unit 91. That is, the first calculation unit 96 refers to the first separation distance D1 stored in the storage unit 91 when calculating the standard tape length L1.

Further, in the equation (1), "DS" indicates a travel distance of the component storage tapes 100A and 100B fed out by the first sprocket 311 of the first tape feed-out unit 31 until the first tape detection unit 24 detects the tip 1001 of the component storage tapes 100A and 100B. The travel distance DS is calculated by the tape travel distance calculation unit 92 based on the first encoder signal output from the first encoder 317. That is, when calculating the standard tape length L1, the first calculation unit 96 refers to the travel distance DS calculated by the tape travel distance calculation unit 92.

The first calculation unit 96 can calculate the standard tape length L1 based on the first separation distance D1 regarding an arrangement position of the first tape detection unit 24 and the travel distance DS of the component storage tapes 100A and 100B according to the detection result of the first tape detection unit 24. Here, the tape detection units 23, 24, and 25 provided in the component supply device 1 including the first tape detection unit 24 can detect the same portion of the tip 1001 regardless of the shape of the tip 1001 of the component storage tapes 100A and 100B as described above. For this reason, the first calculation unit 96 using the detection result of the first tape detection unit 24 can accurately calculate the standard tape length L1.

Here, the wide component storage tapes 100A and 100B having the length K2 in the tape width direction of 32 mm or more have the holes 101b at both ends in the tape width direction. In the first loading operation, the second sprocket 321 of the second tape feed-out unit 32 receives the component storage tapes 100A and 100B in a state of rotating at a speed higher than a tape traveling speed of the component storage tapes 100A and 100B by the first sprocket 311 of the first tape feed-out unit 31. The fitting of the holes 101b of the component storage tapes 100A and 100B to the tooth portion 321a of the second sprocket 321 is performed using a speed difference between the tape traveling speed and a rotational speed of the second sprocket 321. For this reason, among the holes 101*b* at both ends in the tape width direction in the component storage tapes 100A and 100B, the hole 101*b* of which end is dominantly fitted to the tooth portion 321*a* of the second sprocket 321 is uncertain. Furthermore, the wide component storage tapes 100A and 100B travel on the traveling path 5 while bending. Accordingly, the travel distance of the component storage tapes 100A and 100B to be fed out by the second sprocket 321 of the second tape feed-out unit 32 cannot be set in advance so that the center of the component storage unit 101*a* in the component storage tapes 100A and 100B coincides with the component extraction position 21.

In view of the above, as shown in FIGS. 15A and 15B, the second calculation unit 97 calculates, based on the standard tape length L1 calculated by the first calculation unit 96, a target feed-out length L2 of the component storage tapes 100A and 100B to be fed out by the second sprocket 321 of the second tape feed-out unit 32, so that the center of a leading component storage unit in which the component E is stored in the component storage tapes 100A and 100B coincides with the component extraction position 21. Note that, in the example illustrated in FIG. 15A, two of the component storage units 101*a*B from the tip 1001 in the first component storage tape 100A are empty component storage units in which component E is not stored. For this reason, a leading component storage unit in which the component E is stored in the first component storage tape 100A is a third component storage unit (that is, the standard component storage unit 101*a*A) from the tip 1001. For this reason, in a case where the first component storage tape 100A is used, the second calculation unit 97 calculates the target feed-out length L2 so that the center 101*a*AA of the component storage unit 101*a*A, which is the leading component storage unit in the first component storage tape 100A, coincides with the component extraction position 21. Further, in the example shown in FIG. 15B, the leading component storage unit in which the component E is stored in the second component storage tape 100B is a first component storage unit 101*a*C from the tip 1001. For this reason, in a case where the second component storage tape 100B is used, the second calculation unit 97 calculates the target feed-out length L2 so that a center 101*a*CA of the component storage unit 101*a*C, which is the leading component storage unit in the second component storage tape 100B, coincides with the component extraction position 21.

Specifically, the second calculation unit 97 calculates the target feed-out length L2 based on an equation (2) below:

$$\text{Target feed-out length } L2 = (L1 - P1 \times N1) + D2 \quad (2)$$

In the equation (2), "L1" indicates a standard tape length calculated by the first calculation unit 96. Further, in the equation (2), "P1" indicates a length between the centers of adjacent ones of the component storage units 101*a* in the component storage tapes 100A and 100B. The length P1 between the centers of the component storage units 101*a* is stored in advance in the storage unit 91. That is, when calculating the target feed-out length L2, the second calculation unit 97 refers to the length P1 between the centers of the component storage units 101*a* stored in the storage unit 91.

Further, in the equation (2), "N1" indicates the number of the component storage units 101*a*, storing the component E, within the range of the standard tape length L1 from the tip 1001 in the component storage tapes 100A and 100B. The second calculation unit 97 calculates the number "N1" of the component storage units 101*a* so as to satisfy an equation (A) and an equation (B) below:

$$P1 \times N1 < L1 \quad (A)$$

$$P1 \times (N1+1) > L1 \quad (B)$$

In the equations (A) and (B), "P1" indicates a length between centers of adjacent ones of the component storage units 101*a* in the component storage tapes 100A and 100B, and "L1" indicates a standard tape length calculated by the first calculation unit 96.

In a case where the first component storage tape 100A is used as in the example illustrated in FIG. 15A, only the empty component storage unit 101*a*B exists within the range of the standard tape length L1 from the tip 1001. For this reason, in a case where the first component storage tape 100A is used, the number "N1" of the component storage units 101*a*, storing the component E, within the range of the standard tape length L1 from the tip 1001 is "zero (0)".

On the other hand, in a case where the second component storage tape 100B is used as in the example illustrated in FIG. 15B, the number "N1" of the component storage units 101*a*, storing the component E, within the range of the standard tape length L1 from the tip 1001 is "2". Note that, in a case where the second component storage tape 100B is used, the constituent "L1−P1×N1" of the equation (2) corresponds to the length L1A (see FIG. 14B) from the tip 1001 of the second component storage tape 100B to the center 101*a*CA of the leading component storage unit 101*a*C.

Further, in the equation (2), "D2" indicates the second separation distance in the tape feeding direction H between the second tape detection unit 25 and the component extraction position 21. The second separation distance D2 is stored in advance in the storage unit 91. That is, the second calculation unit 97 refers to the second separation distance D2 stored in the storage unit 91 when calculating the target feed-out length L2.

The second calculation unit 97 can calculate the target feed-out length L2 based on the standard tape length L1 calculated by the first calculation unit 96, the length P1 between the centers of adjacent ones of the component storage units 101*a* in the component storage tapes 100A and 100B, and the second separation distance D2 related to the arrangement position of the second tape detection unit 25.

The second calculation unit 97 calculates the target feed-out length L2 by substituting zero (0) into "N1" in the equation (2) when the operation mode switching unit 98 sets the first feed-out operation mode for feeding out the first component storage tape 100A. On the other hand, the second calculation unit 97 calculates the target feed-out length L2 by substituting the number, "2", of the component storage units 101*a* within the range of the standard tape length L1 from the tip 1001 into "N1" in the equation (2) when the operation mode switching unit 98 sets the second feed-out operation mode for feeding out the second component storage tape 100B.

Between the first component storage tape 100A and the second component storage tape 100B, the arrangement positions of the leading component storage units 101*a*, in which the component E is stored, are different. Even in a case where the component storage tapes 100A and 100B, which are of different types as described above, are introduced to the first sprocket 311 of the first tape feed-out unit 31 through the tape introduction guiding unit 8, the second calculation unit 97 can calculate the target feed-out length L2 according to the types of the component storage tapes 100A and 100B based on the equation (2) described above.

For this reason, the second sprocket 321 of the second tape feed-out unit 32 controlled by the second tape feed-out control unit 95 described later can feed the component storage tapes 100A and 100B so that the center of the leading component storage unit 101a coincides with the component extraction position 21 according to the types of the component storage tapes 100A and 100B.

When the tip 1001 of the component storage tapes 100A and 100B fed out by the first sprocket 311 of the first tape feed-out unit 31 reaches the second sprocket 321 of the second tape feed-out unit 32, the second tape feed-out control unit 95 controls the second servomotor 324 of the second tape feed-out unit 32 so that the component storage tapes 100A and 100B are fed based on the target feed-out length L2 calculated by the second calculation unit 97. Note that when the second sprocket 321 of the second tape feed-out unit 32 is rotated by the control of the second servomotor 324 by the second tape feed-out control unit 95, the third sprocket 331 of the third tape feed-out unit 33 also rotates in conjunction therewith.

Specifically, the second tape feed-out control unit 95 controls the second servomotor 324 of the second tape feed-out unit 32, so that the travel distance of the component storage tapes 100A and 100B after the tip 1001 is detected by the second tape detection unit 25 coincides with the target feed-out length L2 calculated by the second calculation unit 97. Note that the travel distance of the component storage tapes 100A and 100B after the tip 1001 is detected by the second tape detection unit 25 is calculated by the tape travel distance calculation unit 92 based on the second encoder signal output from the second encoder 327.

When the second sprocket 321 is driven by the control of the second tape feed-out control unit 95 based on the target feed-out length L2 calculated by the second calculation unit 97 as described above, the center of the component storage unit 101a in the component storage tapes 100A and 100B becomes in a state of coinciding with the component extraction position 21. Here, the tape detection units 23, 24, and 25 provided in the component supply device 1 including the second tape detection unit 25 can detect the same portion of the tip 1001 regardless of the shape of the tip 1001 of the component storage tapes 100A and 100B as described above. Then, the second sprocket 321 is driven by the control of the second tape feed-out control unit 95, so that the travel distance of the component storage tapes 100A and 100B after the tip 1001 is detected by the second tape detection unit 25 coincides with the target feed-out length L2 calculated by the second calculation unit 97. For this reason, in the component storage tapes 100A and 100B, the center of the component storage unit 101a and the component extraction position 21 can be caused to accurately coincide with each other regardless of the shape of the tip 1001 of the component storage tapes 100A and 100B.

In the component storage tapes 100A and 100B fed out by the second sprocket 321 of the second tape feed-out unit 32, when the center of the component storage unit 101a is in a state of coinciding with the component extraction position 21, as shown in FIG. 16, an apex 331aAT of one tooth portion 331aA of the third sprocket 331 of the third tape feed-out unit 33 is positioned on an imaginary line SA perpendicular to the component storage tapes 100A and 100B passing through a rotation center 331T of the third sprocket 331. In such a state, the number of the tooth portions 331a of the third sprocket 331 fitted to the holes 101b of the component storage tapes 100A and 100B is maximized. For this reason, it is possible to suitably hold a state in which the center of the component storage unit 101a coincides with the component extraction position 21.

Regarding a wide component storage tape 100 having a width K2 of 32 mm or more in the tape width direction, according to JIS C 0806-3:2014 (IEC 60286-3:2013), it is defined that the tape is designed such that the center of each of the component storage units 101a is positioned at the center between adjacent ones of the holes 101b in the tape feeding direction H. Based on the standard for the component storage tape 100, the third sprocket 331 of the third tape feed-out unit 33 is disposed so that a third separation distance D3 in the tape feeding direction H between the rotation center 331T of the third sprocket 331 and the component extraction position 21 satisfies an equation (3) below:

$$\text{Third separation distance } D3 = P2 \times N2 + P2/2 \tag{3}$$

In the equation (3), "P2" indicates a length between adjacent ones of the holes 101b in the component storage tapes 100A and 100B, and "N2" indicates an optional natural number. In the example illustrated in FIG. 16, "N2" in the equation (3) is "2".

In a case where the component storage tapes 100A and 100B are designed based on the above standard, the third sprocket 331 of the third tape feed-out unit 33 is disposed such that the third separation distance D3 satisfies the equation (3) described above. In this manner, in a state where the center of the component storage unit 101a coincides with the component extraction position 21, the apex 331aAT of one tooth portion 331aA of the third sprocket 331 can be positioned on the imaginary line SA passing through the rotation center 331T of the third sprocket 331.

As described above, when the center 101aAA of the standard component storage unit 101aA in the component storage tapes 100A and 100B is aligned with the mark 821A of the tape introduction guiding unit 8, and the component storage tapes 100A and 100B are introduced to the first sprocket 311 of the first tape feed-out unit 31 through the tape introduction guiding unit 8, the first loading operation is executed. In the first loading operation, the first sprockets 311 of the first tape feed-out unit 31 controlled by the first tape feed-out control unit 94 feeds out the component storage tapes 100A and 100B. During the feed-out operation of the component storage tapes 100A and 100B by the first sprocket 311, the first calculation unit 96 calculates the standard tape length L1. Furthermore, the second calculation unit 97 calculates the target feed-out length L2 of the component storage tapes 100A and 100B to be fed out by the second sprocket 321 of the second tape feed-out unit 32 based on the standard tape length L1. Then, the second sprocket 321 of the second tape feed-out unit 32 controlled by the second tape feed-out control unit 95 feeds out the component storage tapes 100A and 100B based on the target feed-out length L2 calculated by the second calculation unit 97.

Here, the target feed-out length L2 referred to when the second sprocket 321 feeds out the component storage tapes 100A and 100B is set so that the center of the leading component storage unit 101a in which the component E is stored in the component storage tapes 100A and 100B coincides with the component extraction position 21. Therefore, when the second sprocket 321 is driven by the control of the second tape feed-out control unit 95 based on the target feed-out length L2 calculated by the second calculation unit 97, the center of the leading component storage unit 101a in the component storage tapes 100A and 100B becomes in a state of coinciding with the component extraction position 21. For this reason, at the component extraction position 21, the extraction property of the component E by the head unit 14 from the component storage unit 101a of the component storage tapes 100A and 100B is improved. As a result, the component supply device 1 can efficiently supply the component E stored in the component storage tapes 100A and 100B to the component extraction position 21.

Note that the center of the leading component storage unit 101a in the component storage tapes 100A and 100B is preferably in a state of coinciding with the component extraction position 21 when the head unit 14 performs the component extraction operation. That is, the configuration may be such that at the time point at which the center of the leading component storage unit 101a of the component storage tapes 100A and 100B is at a position on the upstream side by a predetermined length (for example, the length P1 between the centers of adjacent ones of the component storage units 101a in the component storage tapes 100A and 100B) with respect to the component extraction position 21, the first loading operation in the component supply device 1 is finished. In this case, the second sprocket 321 of the second tape feed-out unit 32 controlled by the second tape feed-out control unit 95 feeds out the component storage tapes 100A and 100B based on a value obtained by subtracting the length P1 between the centers of adjacent ones of the component storage units 101a from the target feed-out length L2 calculated by the second calculation unit 97.

Then, when the communication control unit 99, which is connected to the component mounting machine 10 such that data communication can be performed, receives a component supply request signal indicating a supply request for the component E to the head unit 14, the second sprocket 321 and the third sprocket 331 controlled by the second tape feed-out control unit 95 execute the second loading operation of intermittently feeding the component storage tapes 100A and 100B by the length P1 between the centers of adjacent ones of the component storage units 101a. In this manner, the center of the leading component storage unit 101a in the component storage tapes 100A and 100B is in a state of coinciding with the component extraction position 21.

Further, the component mounting machine 10 according to the present embodiment includes the component supply device 1 that can efficiently supply the component E stored in the component storage tapes 100A and 100B to the component extraction position 21. For this reason, lowering in production efficiency of a mounted substrate by the component mounting machine 10 can be suppressed as much as possible.

Note that the disclosure which has a configuration described below is mainly included in the specific embodiment described above.

A component supply device according to one aspect of the present disclosure is a component supply device that supplies a component to a component extraction position using a component storage tape in which a plurality of component storage units storing the component are arranged at predetermined intervals. The component supply device includes a first tape feed-out unit that feeds out the component storage tape in a tape feeding direction along an arrangement direction of the component storage units, a second tape feed-out unit that is disposed on a downstream side in the tape feeding direction of the first tape feed-out unit and receives the component storage tape fed out by the first tape feed-out unit to feed out the component storage tape toward the component extraction position, a tape introduction guiding unit that is disposed on an upstream side in the tape feeding direction of the first tape feed-out unit and guides introduction of the component storage tape to the first tape feed-out unit, and a control unit that controls the first tape feed-out unit and the second tape feed-out unit. The tape introduction guiding unit has a mark that is aligned with a center of a standard component storage unit in the component storage tape when the component storage tape is introduced to the first tape feed-out unit, the control unit includes a first tape feed-out control unit that controls the first tape feed-out unit to feed out the component storage tape when the component storage tape is introduced to the first tape feed-out unit through the tape introduction guiding unit, a first calculation unit that calculates a standard tape length indicating a length from a tip of the component storage tape fed out by the first tape feed-out unit to a center of the standard component storage unit, a second calculation unit that calculates, based on the standard tape length, a target feed-out length of the component storage tape to be fed out by the second tape feed-out unit so that a center of a leading component storage unit in which a component in the component storage tape is stored coincides with the component extraction position, and a second tape feed-out control unit that controls the second tape feed-out unit so that the component storage tape is fed out based on the target feed-out length when a tip of the component storage tape fed out by the first tape feed-out unit reaches the second tape feed-out unit.

According to the component supply device, when the center of the reference component storage unit in the component storage tape is aligned with the mark of the tape introduction guiding unit, and the component storage tape is introduced to the first tape feed-out unit through the tape introduction guiding unit, the loading operation is executed. In the loading operation, the first tape feed-out unit controlled by the first tape feed-out control unit feeds out the component storage tape. During the feed-out operation of the component storage tape by the first tape feed-out unit, the first calculation unit calculates the standard tape length. Furthermore, the second calculation unit calculates the target feed-out length of the component storage tape to be fed out by the second tape feed-out unit based on the standard tape length. Then, the second tape feed-out unit controlled by the second tape feed-out control unit feeds out the component storage tape based on the target feed-out length calculated by the second calculation unit.

Here, the target feed-out length, which is referred to when the second tape feed-out unit feeds out the component storage tape, is set such that the center of the leading component storage unit storing the component in the component storage tape coincides with the component extraction position. Therefore, when the second tape feed-out unit is driven by the control of the second tape feed-out control unit based on the target feed-out length calculated by the second calculation unit, the center of the leading component storage unit in the component storage tape is in the state of coinciding with the component extraction position. For this reason, at the component extraction position, extraction property of a component from the component storage unit of the component storage tape is improved. As a result, the component supply device can efficiently supply the component stored in the component storage tape to the component extraction position.

The component supply device may be configured to further include the first tape detection unit that is disposed between the first tape feed-out unit and the second tape feed-out unit in the tape feeding direction, and detects the component storage tape fed out by the first tape feed-out unit. Then, the first calculation unit calculates the standard tape length based on the equation (1) below:

Standard tape length $L1=D1-DS$ (1)

In the equation (1), "D1" indicates a first separation distance in the tape feeding direction between the mark of the tape introduction guiding unit and the first tape detection unit. Further, in the equation (1), "DS" indicates a travel distance of the component storage tape fed out by the first tape feed-out unit until the first tape detection unit detects a tip of the component storage tape.

In this aspect, the first calculation unit can calculate the standard tape length L1 based on the first separation distance D1 regarding an arrangement position of the first tape detection unit and the travel distance DS of the component storage tape according to the detection result of the first tape detection unit.

The component supply device may be configured to further include the second tape detection unit that is disposed between the second tape feed-out unit and the component extraction position in the tape feeding direction, and detects the component storage tape fed out by the second tape feed-out unit. Then, the second calculation unit calculates the target feed-out length based on the equation (2) below, and the second tape feed-out control unit controls the second tape feed-out unit such that the travel distance of the component storage tape after the tip is detected by the second tape detection unit coincides with the target feed-out length:

Target feed-out length $L2=(L1-P1 \times N1)+D2$ (2)

In the equation (2), "L1" indicates a standard tape length, and "P1" indicates a length between centers of adjacent ones of the component storage units in the component storage tape. Further, in the equation (2), "N1" indicates the number of component storage units, storing the component, within the range of the standard tape length from the tip in the component storage tape. Further, in the equation (2), "D2" indicates the second separation distance in a tape feeding direction between the second tape detection unit and the component extraction position.

In this aspect, the second calculation unit can calculate the target feed-out length L2 based on the standard tape length L1 calculated by the first calculation unit, the length P1 between the centers of adjacent ones of the component storage units in the component storage tape, and the second separation distance D2 related to the arrangement position of the second tape detection unit. Then, the second tape feed-out control unit controls the second tape feed-out unit such that the travel distance of the component storage tape after the tip is detected by the second tape detection unit coincides with the target feed-out length L2. In this manner, the second tape feed-out unit can feed out the component storage tape so that the center of the leading component storage unit coincides with the component extraction position.

In the above-described component supply device, the component storage tape includes a first component storage tape in which an empty component storage unit storing no component is disposed within the range of the standard tape length from the tip, and a second component storage tape in which all of the component storage units store a component. The control unit further includes an operation mode switching unit that switches an operation mode between a first feed-out operation mode for feeding out the first component storage tape and a second feed-out operation mode for feeding out the second component storage tape in accordance with a type of a component storage tape introduced to the first tape feed-out unit through the tape introduction guiding unit. Then, the second calculation unit calculates the target feed-out length by substituting zero into N1 in the equation (2) when the operation mode switching unit sets the operation mode to the first feed-out operation mode, and calculates the target feed-out length by substituting the number of component storage units within a range of the standard tape length from a tip into N1 in the equation (2) when the operation mode switching unit sets the operation mode to the second feed-out operation mode.

Between the first component storage tape and the second component storage tape, the arrangement positions of the leading component storage units, in which the component is stored, are different. Even in a case where the component storage tapes, which are of different types as described above, are introduced to the first tape feed-out unit through the tape introduction guiding unit, the second calculation unit can calculate the target feed-out length L2 according to the types of the component storage tapes based on the equation (2) described above. For this reason, the second tape feed-out unit controlled by the second tape feed-out control unit can feed out the component storage tape so that the center of the leading component storage unit coincides with the component extraction position according to the type of component storage tape.

The component supply device described above may further include a third tape feed-out unit that is provided close to the component extraction position on the downstream side in the tape feeding direction of the second tape feed-out unit, and feeds out the component storage tape in conjunction with the second tape feed-out unit. Then, the second tape feed-out control unit controls the third tape feed-out unit in addition to the second tape feed-out unit.

In this aspect, the third tape feed-out unit receives the component storage tape fed out by the second tape feed-out unit, and feeds out the component storage tape so that the component storage tape passes through the component extraction position. By the configuration in which the third tape feed-out unit is provided close to the component extraction position and the third tape feed-out unit receives the component storage tape, the component storage tape can be fed out in a state of being positioned at the component extraction position with high accuracy.

In the above-described component supply device, the component storage tape has a plurality of the holes arranged at predetermined intervals in the tape feeding direction. Each of the first tape feed-out unit, the second tape feed-out unit, and the third tape feed-out unit includes a sprocket that is rotatably provided about an axis extending in a tape width direction crossing the tape feeding direction, and has a plurality of tooth portions fitted to the holes of the component storage tape. Then, in the component storage tape fed out by the second tape feed-out unit, when a center of the component storage unit is in a state of coinciding with the component extraction position, an apex of one tooth portion of a sprocket in the third tape feed-out unit is positioned on an imaginary line perpendicular to the component storage tape passing through a rotation center of the sprocket.

In this aspect, when the center of the component storage unit is in a state of coinciding with the component extraction position, the apex of one tooth portion of the sprocket in the third tape feed-out unit is positioned on an imaginary line passing through the rotation center of the sprocket. In such a state, the number of tooth portions of the sprocket fitted with the hole of the component storage tape becomes maximum. For this reason, it is possible to suitably hold a state in which the center of the component storage unit coincides with the component extraction position.

In the component supply device described above, a sprocket of the third tape feed-out unit is disposed such that a third separation distance in the tape feeding direction between a rotation center of the sprocket and the component extraction position satisfies the equation (3) below:

Third separation distance $D3=P2 \times N2+P2/2$  (3)

In the equation (3), "P2" indicates a length between adjacent holes in the component storage tape, and "N2" indicates an optional natural number.

Regarding the wide component storage tape having a width of 32 mm or more in the tape width direction, according to JIS C 0806-3:2014 (IEC 60286-3:2013), it is defined that the tape is designed such that the center of each of the component storage units is positioned at the center between adjacent ones of the holes in the tape feeding direction. In a case where the component storage tape is designed based on the above standard, the sprocket of the third tape feed-out unit is disposed such that the third separation distance D3 satisfies the equation (3) described above. In this manner, in a state where the center of the component storage unit coincides with the component extraction position, the apex of one tooth portion in the sprocket of the third tape feed-out unit can be positioned on the imaginary line passing through the rotation center of the sprocket.

A component mounting machine according to another aspect of the present disclosure includes the component supply device, and a head unit that takes out a component supplied to the component extraction position by the component supply device.

According to this component mounting machine, the component supply device is provided which can efficiently supply a component stored in the component storage tape to the component extraction position. For this reason, lowering in production efficiency of a mounted substrate by the component mounting machine can be suppressed as much as possible.

As described above, the present disclosure can provide a component supply device that supplies a component stored in the component storage tape to the component extraction position, the component supply device capable of efficiently supplying a component, and a component mounting machine including the component supply device.

What is claimed is:

1. A component supply device for supplying a component to a component extraction position using a component storage tape in which a plurality of component storage units for storing the component are arranged at predetermined intervals, the component supply device comprising:
   a first tape feed-out unit configured to feed out the component storage tape in a tape feeding direction along an arrangement direction of the component storage units;
   a second tape feed-out unit that is disposed on a downstream side in the tape feeding direction of the first tape feed-out unit and is configured to receive the component storage tape fed out by the first tape feed-out unit to feed out the component storage tape toward the component extraction position;
   a tape introduction guide that is disposed on an upstream side in the tape feeding direction of the first tape feed-out unit and is configured to guide introduction of the component storage tape to the first tape feed-out unit, the tape introduction guide having a mark that is aligned with a center of a standard component storage unit in the component storage tape when the component storage tape is introduced to the first tape feed-out unit; and
   a controller configured to control the first tape feed-out unit and the second tape feed-out unit, the controller including
   a first tape feed-out controller configured to control the first tape feed-out unit to feed out the component storage tape when the component storage tape is introduced to the first tape feed-out unit through the tape introduction guide,
   a first calculator configured to calculate a standard tape length indicating a length from a tip of the component storage tape fed out by the first tape feed-out unit to a center of the standard component storage unit,
   a second calculator configured to calculate, based on the standard tape length, a target feed-out length of the component storage tape to be fed out by the second tape feed-out unit so that a center of a leading component storage unit in which a component in the component storage tape is stored coincides with the component extraction position, and
   a second tape feed-out controller configured to control the second tape feed-out unit so that the component storage tape is fed out based on the target feed-out length when a tip of the component storage tape fed out by the first tape feed-out unit reaches the second tape feed-out unit.

2. The component supply device according to claim 1, further comprising a first tape detector that is disposed between the first tape feed-out unit and the second tape feed-out unit in the tape feeding direction, and is configured to detect the component storage tape fed out by the first tape feed-out unit,
   wherein the first calculator R configured to calculate the standard tape length based on an equation (1) below:

$L1=D1 \cdot DS$  (1)

wherein L1 indicates the standard tape length, D1 indicates a first separation distance in a tape feeding direction between the mark of the tape introduction guide, and the first tape detector and DS indicates a travel distance of the component storage tape fed out by the first tape feed-out unit until the first tape detector detects the tip of the component storage tape.

3. The component supply device according to claim 2, further comprising a second tape detector that is disposed between the second tape feed-out unit and the component extraction position in the tape feeding direction and is configured to detect the component storage tape fed out by the second tape feed-out unit,
   wherein the second calculator is configured to calculate the target feed-out length based on an equation (2) below, and
   the second tape feed-out controller is configured to control the second tape feed-out unit such that the travel distance of the component storage tape after the tip is detected by the second tape detector coincides with the target feed-out length:

$L2=(L1-P1 \times N1)+D2$  (2)

wherein L2 indicates the target feed-out length, L1 indicates the standard tape length, P1 indicates a length between centers of adjacent component storage units in the component storage tape, N1 indicates a number of component storage units, storing a component, within a range of the standard tape length from the tip in the component storage tape, and D2 indicates a second separation distance in the tape feeding direction between the second tape detector and the component extraction position.

4. The component supply device according to claim 3, wherein
the component storage tape includes a first component storage tape in which an empty component storage unit storing no component is arranged within a range of the standard tape length from the tip, and a second component storage tape in which a component is stored in all of the component storage units,
the controller further includes an operation mode switch configured to switch an operation mode between a first feed-out operation mode for feeding out the first component storage tape and a second feed-out operation mode for feeding out the second component storage tape in accordance with a type of a component storage tape introduced to the first tape feed-out unit through the tape introduction guide, and
the second calculator is configured to
calculate the target feed-out length by substituting zero into N1 in the equation (2) when the operation mode switch sets the operation mode to the first feed-out operation mode, and
calculate the target feed-out length by substituting the number of component storage units within the range of the standard tape length from the tip into N1 in the equation (2) when the operation mode switch sets the operation mode to the second feed-out operation mode.

5. The component supply device according to claim 4, further comprising a third tape feed-out unit that is provided close to the component extraction position on a downstream side in the tape feeding direction of the second tape feed-out unit, and is configured to feed out the component storage tape in conjunction with the second tape feed-out unit,
wherein the second tape feed-out controller is configured to control the third tape feed-out unit in addition to the second tape feed-out unit.

6. The component supply device according to claim 5, wherein
the component storage tape has a plurality of holes arranged at predetermined intervals in the tape feeding direction,
each of the first tape feed-out unit, the second tape feed-out unit, and the third tape feed-out unit includes a sprocket that is rotatably provided about an axis extending in a tape width direction crossing the tape feeding direction, and that has a plurality of tooth portions fitted to the holes of the component storage tape, and in the component storage tape fed out by the second tape feed-out unit, when a center of the component storage unit is in a state of coinciding with the component extraction position, an apex of one of the tooth portions of the sprocket in the third tape feed-out unit is positioned on an imaginary line perpendicular to the component storage tape passing through a rotation center of the sprocket.

7. The component supply device according to claim 6, wherein
a sprocket of the third tape feed-out unit is disposed such that a third separation distance in the tape feeding direction between a rotation center of the sprocket and the component extraction position satisfies an equation (3) below:

$$D3 = P2 \times N2 + P2/2 \tag{3}$$

wherein D3 indicates the third se ration distance, P2 indicates a length between adjacent holes in the component storage tape, and N2 indicates an optional natural number.

8. A component mounting machine comprising:
the component supply device according to claim 1; and
a head unit configured to take out a component supplied to the component extraction position by the component supply device.

9. A component mounting machine comprising:
the component supply device according to claim 2; and
a head unit configured to take out a component supplied to the component extraction position by the component supply device.

10. A component mounting machine comprising:
the component supply device according to claim 3; and
a head unit configured to take out a component supplied to the component extraction position by the component supply device.

11. A component mounting machine comprising:
the component supply device according to claim 4; and
a head unit configured to take out a component supplied to the component extraction position by the component supply device.

12. A component mounting machine comprising:
the component supply device according to claim 5; and
a head unit configured to take out a component supplied to the component extraction position by the component supply device.

13. A component mounting machine comprising:
the component supply device according to claim 6; and
a head unit configured to take out a component supplied to the component extraction position by the component supply device.

* * * * *